(12) United States Patent
Nakatani et al.

(10) Patent No.: US 7,746,152 B2
(45) Date of Patent: Jun. 29, 2010

(54) SWITCH CIRCUIT DEVICE, AND WIRELESS CIRCUIT DEVICE AND SAMPLING CIRCUIT DEVICE EMPLOYING THE SAME

(75) Inventors: Toshifumi Nakatani, Osaka (JP); Mikihiro Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 548 days.

(21) Appl. No.: 11/806,972

(22) Filed: Jun. 5, 2007

(65) Prior Publication Data

US 2007/0285149 A1    Dec. 13, 2007

(30) Foreign Application Priority Data

Jun. 7, 2006    (JP)    ............... 2006-158451

(51) Int. Cl.
    *H03K 17/16*    (2006.01)
(52) U.S. Cl. .................. 327/389; 327/436
(58) Field of Classification Search .......... 327/389, 327/391, 427, 434, 436, 437
    See application file for complete search history.

(56) References Cited

U.S. PATENT DOCUMENTS

| | | | | |
|---|---|---|---|---|
| 4,259,686 A * | 3/1981 | Suzuki et al. | ............... | 327/100 |
| 5,434,526 A * | 7/1995 | Tanigashira et al. | ......... | 327/389 |
| 7,268,613 B2 * | 9/2007 | Cranford et al. | ............ | 327/537 |
| 7,486,127 B2 * | 2/2009 | Cranford et al. | ............ | 327/534 |

FOREIGN PATENT DOCUMENTS

| | | |
|---|---|---|
| JP | 11-163647 | 6/1999 |
| JP | 2005-515657 | 5/2005 |

OTHER PUBLICATIONS

Ishida et al., "Managing Leakage in Charge-Based Analog Circuits with Low-$V_{th}$ Transistors by Analog T-Switch (AT-Switch) and Super Cut-off CMOS", *IEEE JSAP Symposium on VLSI Circuits Digest and Technical Papers*, pp. 122-125, Jun. 2005.
Kawaguchi et al., "A Super Cut-Off CMOS (SCCMOS) Scheme for 0.5-V Supply Voltage with Picoampere Stand-By Current", *IEEE Journal of Solid-State Circuits*, vol. 35, No. 10, Oct. 2000.

* cited by examiner

*Primary Examiner*—Lincoln Donovan
*Assistant Examiner*—William Hernandez
(74) *Attorney, Agent, or Firm*—Wenderoth, Lind & Ponack, L.L.P.

(57) ABSTRACT

A switch circuit device with improved insertion loss characteristics and isolation characteristics is provided. The switch circuit of the present invention includes a plurality of n-ch MOSFETs whose gates are connected together and whose drains and sources are connected in series, a p-ch MOSFET whose gate is connected to the gates of the plurality of n-ch MOSFETs and whose drain is connected to the source and drain of at least one pair of adjacent n-ch MOSFETs, and a voltage changing circuit for applying a low voltage to the source of the p-ch MOSFET while a high-level control voltage is applied to the gate of the p-ch MOSFET, and a high voltage to the source of the p-ch MOSFET while a low-level control voltage is applied to the gate of the p-ch MOSFET.

15 Claims, 15 Drawing Sheets

N-CH SWITCH 101

N-CH SWITCH 102

N-CH SWITCH 103

N-CH SWITCH 104

P-CH SWITCH 200

P-CH SWITCH 201

P-CH SWITCH 202

P-CH SWITCH 203

TRANSFER GATE SWITCH 300

TRANSFER GATE SWITCH 301

N-CH SWITCH 400

P-CH SWITCH 500

TRANSFER GATE SWITCH 600

SWITCH CIRCUIT DEVICE, AND WIRELESS CIRCUIT DEVICE AND SAMPLING CIRCUIT DEVICE EMPLOYING THE SAME

BACKGROUND OF THE INVENTION

1. Field of the Invention

The present invention relates to a switch circuit device having less leakage current.

2. Description of the Background Art

In recent years, an IC has been further miniaturized so as to increase the packaging density of a high-frequency circuit and a whole circuit. Such an IC includes a number of switch circuit devices, and these switch circuit devices are formed of a MOSFET (s). Conventionally, the switch circuit device is formed of a single MOSFET or a pair of an n-ch MOSFET and a p-ch MOSFET (called a transfer gate). Here, as the IC is further miniaturized, the power supply voltage and the threshold voltage of the MOSFET are decreased. Therefore, insertion loss when the switch circuit device is in the conduction state (hereinafter referred to as ON) increases, and also, isolation characteristics when the switch circuit device is in the current interrupt state (hereinafter referred to as OFF) are deteriorated.

Japanese Laid-Open Patent Publication No. 11-163647 discloses a switch circuit device which solves such a problem. FIG. 23 is a diagram showing a configuration of the conventional switch circuit device of Japanese Laid-Open Patent Publication No. 11-163647. In the switch circuit device of FIG. 23, leakage current is reduced by changing the back gate potential of a MOSFET between when the MOSFET is ON and when the MOSFET is OFF.

Japanese Laid-Open Patent Publication No. 2005-515657 and Hiroshi Kawaguchi, Koichi Nose and Takayasu Sakurai, "A Super Cut-Off CMOS (SCCMOS) Scheme for 0.5-V Supply Voltage", JSSC, vol. 35, no. 10, p. 1498-1501, October 2000 (hereinafter referred to as Document 1) describe switch circuit devices. FIGS. 24 and 25 are diagrams showing configurations of the conventional switch circuit devices described in Japanese Laid-Open Patent Publication No. 2005-515657 and Document 1, respectively. In the switch circuit devices of FIGS. 24 and 25, three MOSFETs are connected in series so that leakage current is reduced.

Koichi Ishida, Kouichi Kanda, Atit Tamtrakarn, Hiroshi Kawaguchi and Takayasu Sakurai, "Managing Leakage in Charge-Based Analog Circuits with Low-VTH Transistors by Analog T-Switch (AT-Switch) and Super Cut-off CMOS", VLSI Symposia Circuit 8-3, June 2005 (hereinafter referred to as Document 2) also describes a switch circuit device. FIG. 26 is a diagram showing a configuration of the conventional switch circuit device of Document 2. In the switch circuit device of FIG. 26, three MOSFETs are connected into a T-shape, and a voltage of Vdd/2 is applied to a connection point between two MOSFETs connected in series when the switch circuit device is OFF, thereby improving the isolation characteristics of the switch circuit device. This is achieved by utilizing characteristics that leakage current between the drain and the source of an n-ch MOSFET decreases with an increase in the drain (or source) potential of the n-ch MOSFET when the n-ch MOSFET is OFF and characteristics that leakage current between the drain and the source of a p-ch MOSFET decreases with a decrease in the drain (or source) potential of the p-ch MOSFET when the p-ch MOSFET is OFF.

However, the above-described conventional switch circuit devices have the following problems. In the switch circuit device of FIG. 23, since the switch circuit device is formed of MOSFETs any two or more of which are not connected in series, the effect of improving isolation characteristics when the switch circuit device is OFF is small.

The switch circuit devices of FIGS. 24 and 25 require three MOSFETs connected in series. As each of the MOSFETs connected in series, a MOSFET having a large size is used so as to reduce the insertion loss of the switch circuit device when it is ON. As a result, the footprint in a chip of the MOSFETs connected in series is large.

In the switch circuit device of FIG. 26, when the switch circuit device is OFF, the two MOSFETs connected in series are OFF, and a voltage of Vdd/2 is applied via the drain of the MOSFET connected in parallel to the drains of the MOSFET connected in series. On the other hand, when the switch circuit device is ON, the MOSFET connected in parallel is OFF, and a voltage of Vdd/2 is applied to the drain of the MOSFET connected in parallel. In other word, a constant voltage of Vdd/2 is applied to the drain of the MOSFET connected in parallel no matter whether the switch circuit device is ON or OFF. Therefore, when the switch circuit device is OFF, the OFF-state isolation characteristics are not satisfactorily improved. Also, when the switch circuit device is ON, the isolation characteristics of the MOSFET connected in parallel are deteriorated, resulting in an increase in the insertion loss of the switch circuit device.

SUMMARY OF THE INVENTION

Therefore, an object of the present invention is to provide a switch circuit device in which the ON-state insertion loss is reduced and the OFF-state isolation characteristics are improved as compared to the conventional art, and a wireless circuit device and a sampling circuit device employing the switch circuit device.

The present invention is directed to a switch circuit device employing MOSFETs. To achieve the above-described object, the switch circuit device of the present invention comprises a plurality of n-ch MOSFETs whose gates are connected together and whose drains and sources are connected in series, a p-ch MOSFET whose gate is connected to the gates of the plurality of n-ch MOSFETs and whose drain is connected to the source and drain connected to each other of at least one pair of adjacent n-ch MOSFETs of the plurality of n-ch MOSFETs, and a voltage changing circuit for applying a low voltage to the source of the p-ch MOSFET while a high-level control voltage is applied to the gate of the p-ch MOSFET, the low voltage being lower than the high-level control voltage, and a high voltage to the source of the p-ch MOSFET while a low-level control voltage is applied to the gate of the p-ch MOSFET, the high voltage being higher than the low-level control voltage.

The voltage changing circuit may include an odd number of inverters connected in series for inverting and outputting a control voltage to be applied to the gate of the p-ch MOSFET.

The high voltage applied to the source of the p-ch MOSFET may be equal to a voltage applied to a back gate of the p-ch MOSFET.

Preferably, the high voltage applied to the source of the p-ch MOSFET is a voltage which causes a GIDL current of the n-ch MOSFET to be smaller than or equal to a predetermined value, and the low voltage applied to the source of the p-ch MOSFET is a voltage which causes a GIDL current of the p-ch MOSFET to be smaller than or equal to a predetermined value.

Preferably, depending on the high- or low-level control voltage applied to the gate of the p-ch MOSFET, the voltage changing circuit applies a voltage which causes a sum of a GIDL current and a threshold current of the p-ch MOSFET to be smaller than or equal to a predetermined value, to a back gate of the p-ch MOSFET, and a voltage which causes a sum of a GIDL current and a threshold current of the n-ch MOSFET to be smaller than or equal to a predetermined value, to back gates of the plurality of n-ch MOSFETs.

A resistor or an inductor may be inserted in the gate of each of the n-ch MOSFET and the p-ch MOSFET.

A resistor or an inductor may be inserted in a back gate of each of the n-ch MOSFET and the p-ch MOSFET.

To achieve the above-described object, a switch circuit of the present invention comprises a plurality of p-ch MOSFETs whose gates are connected together and whose drains and sources are connected in series, an n-ch MOSFET whose gate is connected to the gates of the plurality of p-ch MOSFETs and whose source is connected to the source and drain connected to each other of at least one pair of adjacent p-ch MOSFETs of the plurality of p-ch MOSFETs, an inverter for inverting and outputting a control voltage, and a voltage changing circuit for applying a high voltage to the drain of the n-ch MOSFET while a low-level control voltage inverted and output by the inverter is applied to the gate of the n-ch MOSFET, the high voltage being higher than the low-level control voltage, and a low voltage to the drain of the n-ch MOSFET while a high-level control voltage inverted and output by the inverter is applied to the gate of the n-ch MOSFET, the low voltage being lower than the high-level control voltage.

The voltage changing circuit may apply a control voltage to be input to the inverter, as it is, to the drain of the n-ch MOSFET.

The low voltage applied to the drain of the n-ch MOSFET may be 0 V.

Preferably, the low voltage applied to the drain of the n-ch MOSFET is a voltage which causes a GIDL current of the p-ch MOSFET to be smaller than or equal to a predetermined value, and the high voltage applied to the drain of the n-ch MOSFET is a voltage which causes a GIDL current of the n-ch MOSFET to be smaller than or equal to a predetermined value.

Preferably, further, depending on the high- or low-level control voltage inverted and output by the inverter and applied to the gate of the n-ch MOSFET, the voltage changing circuit applies a voltage which causes a sum of a GIDL current and a threshold current of the n-ch MOSFET to be smaller than or equal to a predetermined value, to a back gate of the n-ch MOSFET, and a voltage which causes a sum of a GIDL current and a threshold current of the p-ch MOSFET to be smaller than or equal to a predetermined value, to back gates of the plurality of p-ch MOSFETs.

The voltage changing circuit may include an even number of inverters connected in series for outputting the control voltage.

A resistor or an inductor may be inserted in the gates of the n-ch MOSFET and the p-ch MOSFET.

A resistor or an inductor may be inserted in back gates of the n-ch MOSFET and the p-ch MOSFET.

The present invention is also directed to a wireless circuit device. To achieve the above-described object, the wireless circuit device of the present invention comprises an antenna, a reception circuit, a transmission circuit, and first to fourth switch circuit devices of the present invention. An output of the transmission circuit is connected via the first switch circuit device to the antenna. An input of the first switch circuit device is grounded via the second switch circuit device. The antenna is connected via the third switch circuit device to the reception circuit. An output of the third switch circuit device is grounded via the fourth switch circuit device.

The present invention is also directed to a sampling circuit device. To achieve the above-described object, the sampling circuit device of the present invention comprises an input terminal, an output terminal, a capacitor, and first and second switch circuit devices of the present invention. The input terminal is connected via the first switch circuit device to the output terminal. The capacitor and the second switch circuit device are connected in parallel between the output terminal and the ground.

To achieve the above-described object, a unity gain sampling circuit device of the present invention comprises an input terminal, an output terminal, a capacitor, an operational amplifier, and first to third switch circuit devices of the present invention. The input terminal is connected via the first switch circuit device and the capacitor to an input of the operational amplifier. An output of the operational amplifier is connected to the output terminal. The output of the operational amplifier is connected via the second switch circuit device to an output of the first switch circuit device. The output of the operational amplifier is connected via the third switch circuit device to an output of the capacitor.

To achieve the above-described object, a charge sampling filter circuit device of the present invention comprises an input terminal, an output terminal, first to N-th capacitors (N is a positive integer), and first to 2N-th switch circuit devices of the present invention (N is a positive integer). The input terminal is connected to inputs of the first to N-th switch circuit devices. Outputs of the first to N-th switch circuit devices are connected to inputs of the (N+1)-th to 2N-th switch circuit devices and are grounded via the first to N-th capacitors. Outputs of the (N+1)-th to 2N-th switch circuit devices are connected to the output terminal.

According to the present invention, a switch circuit device can be achieved in which the insertion loss of the ON-state switch circuit device is reduced and the isolation characteristics of the OFF-state switch circuit device are improved, as compared to the conventional art. Also, a wireless circuit device and a sampling circuit device employing the switch circuit device can be achieved.

These and other objects, features, aspects and advantages of the present invention will become more apparent from the following detailed description of the present invention when taken in conjunction with the accompanying drawings.

DESCRIPTION OF THE PREFERRED EMBODIMENTS

A switch circuit device according to the present invention utilizes characteristics that leakage current between the drain and the source of an n-ch MOSFET decreases with an increase in the drain (or source) potential of the n-ch MOSFET and characteristics that leakage current between the drain and the source of a p-ch MOSFET decreases with a decrease in the drain (or source) potential of the p-ch MOSFET, as described in the BACKGROUND OF THE INVENTION section. In the switch circuit device of the present invention, the drain or source potential of a MOSFET is dynamically changed between when the switch circuit device is ON and when it is OFF to reduce leakage current, thereby improving the insertion loss characteristics and the isolation characteristics of the switch circuit device. Note that like parts are indicated by like reference symbols and will not be repeatedly described.

First Embodiment

In a first embodiment, an n-ch switch circuit device which employs an n-ch MOSFET (hereinafter referred to as an nMOS) as a switching circuit will be described.

(1) First Example

Figure 1:
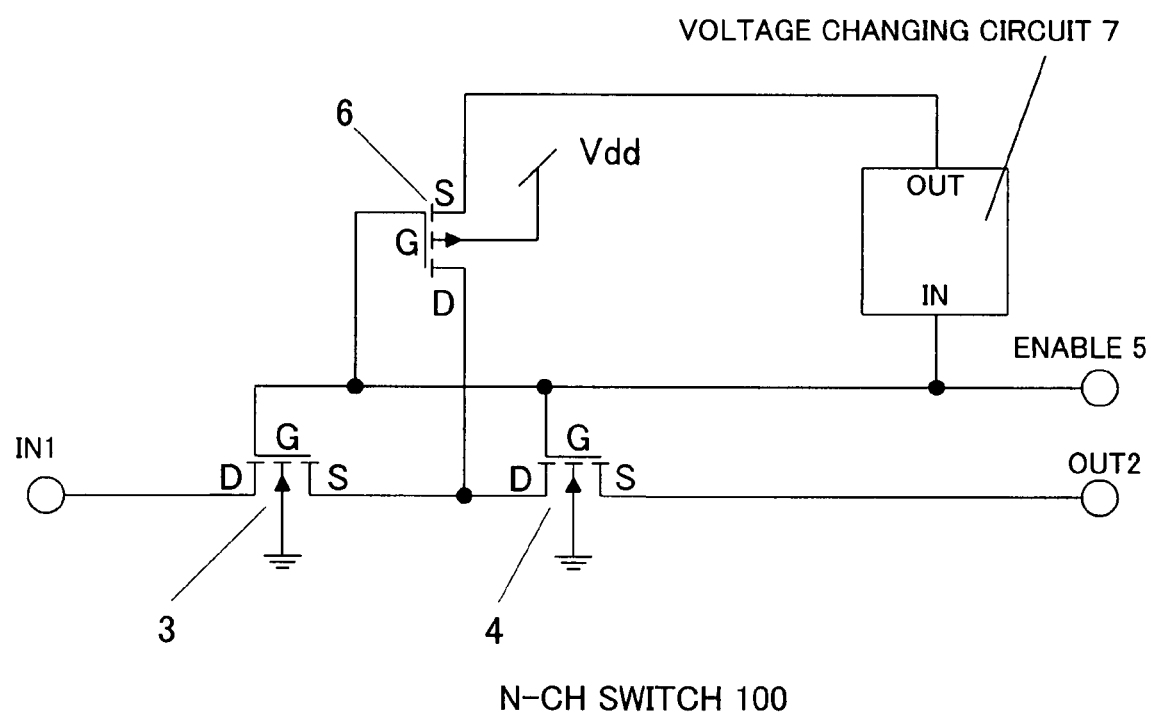
FIG. 1 is a diagram showing a configuration of an n-ch switch circuit device 100 according to a first example of a first embodiment of the present invention.

FIG. 1 is a diagram showing a configuration of an n-ch switch circuit device 100 according to a first example of the first embodiment of the present invention. Note that a p-ch MOSFET is hereinafter referred to as a pMOS. As shown in FIG. 1, the n-ch switch circuit device 100 of the first example comprises an input terminal 1, an output terminal 2, an nMOS 3, an nMOS 4, a pMOS 6, a voltage changing circuit 7, and an ENABLE terminal 5. The nMOS 3 and the nMOS 4 are connected in series between the input terminal 1 and the output terminal 2. The drain of the nMOS 3 is connected to the input terminal 1, and the source of the nMOS 3 is connected to the drain of the nMOS 4. The source of the nMOS 4 is connected to the output terminal 2. The gates of the nMOS 3 and the nMOS 4 are both connected to the ENABLE terminal 5. The back gates of the nMOS 3 and the nMOS 4 are grounded. The drain of the pMOS 6 is connected to a portion at which the source of the nMOS 3 and the drain of the nMOS 4 are connected together. The gate of the pMOS 6 is connected to the ENABLE terminal 5. The source of the pMOS 6 is connected to an output OUT of the voltage changing circuit 7. A power supply voltage Vdd is applied to the back gate of the pMOS 6. An input IN of the voltage changing circuit 7 is connected to the ENABLE terminal 5.

Next, an operation of the n-ch switch circuit device 100 will be described. To turn ON the n-ch switch circuit device 100, a high-level voltage (e.g., the power supply voltage Vdd) is applied to the ENABLE terminal 5. Thereby, the nMOS 3 and the nMOS 4 are turned ON, and the pMOS 6 is turned OFF. While a high-level control voltage is input to the input IN, the voltage changing circuit 7 applies via the output OUT to the source of the pMOS 6 a low-level voltage which causes a GIDL (Gate-Induced-Drain Barrier-Lowing) current of the pMOS 6 to be smaller than or equal to a predetermined threshold (hereinafter referred to as a switch circuit-ON predetermined low voltage) in synchronization with an OFF operation of the PMOS 6. Here, the predetermined threshold for the GIDL current of the pMOS 6 is set to be a value at or below which the insertion loss of the n-ch switch circuit device 100 is caused to be smaller than or equal to a desired value. Note that the GIDL current is a current which leaks from the drain (or source) to the well of the MOSFET when it is OFF, and is a current which is affected by a process (size) or the like of the MOSFET.

By the above-described operation, the isolation characteristics of the pMOS 6 are improved. In other words, when the n-ch switch circuit device 100 is ON, the pMOS 6 connected in parallel is OFF with improved isolation characteristics. In addition, the GIDL current occurring in the PMOS 6 can be caused to be smaller than or equal to a desired threshold. Thereby, the leakage of a current input to the input terminal 1 via the pMOS 6 from the connection portion between the source of the nMOS 3 and the drain of the nMOS 4 can be reduced. As a result, the insertion loss of the n-ch switch circuit device 100 when it is ON can be reduced.

To turn OFF the n-ch switch circuit device 100, a low-level control voltage (e.g., 0 V) is applied to the ENABLE terminal 5. Thereby, the nMOS 3 and the nMOS 4 are turned OFF, and the pMOS 6 is turned ON. While a low-level voltage is applied to the input IN, the voltage changing circuit 7 applies via the output OUT to the source of the pMOS 6 a high-level voltage which causes the GIDL currents of the nMOS 3 and the nMOS 4 to be smaller than or equal to a predetermined threshold (hereinafter referred to as a switch circuit-OFF predetermined high voltage) in synchronization with an ON operation of the pMOS 6. Here, the predetermined threshold for the GIDL currents of the nMOS 3 and the nMOS 4 has a value which secures the desired isolation characteristics of the n-ch switch circuit device 100. The switch circuit-OFF predetermined high voltage is applied via the pMOS 6 to the connection portion between the source of the nMOS 3 and the drain of the nMOS 4.

By the above-described operation, the source potential of the nMOS 3 and the drain potential of the nMOS 4 are increased, and in addition, the GIDL currents occurring in the nMOS 3 and the nMOS 4 can be caused to be smaller than or equal to the desired threshold. Thereby, the isolation characteristics of the nMOS 3 and the nMOS 4 are improved.

As described above, the n-ch switch circuit device 100 dynamically changes the drain (or source) potentials of the pMOS 6, the nMOS 3 and the nMOS 4 between when the n-ch switch circuit device 100 is ON and when it is OFF, and in addition, causes the GIDL currents of the pMOS 6, the nMOS 3 and the nMOS 4 to be smaller than or equal to the desired threshold. Thereby, the n-ch switch circuit device 100 can improve the OFF-state isolation characteristics and reduce the ON-state insertion loss, as compared to conventional switch circuit devices.

Here, exemplary settings of the switch circuit-ON predetermined low voltage and the switch circuit-OFF predetermined high voltage will be described. Note that it is assumed that the low-level voltage and the high-level voltage applied to the ENABLE terminal 5 are 0 V and 1.2 V which is equal to the power supply voltage Vdd, respectively. It is also assumed that the nMOS 3, the nMOS 4 and the pMOS 6 are obtained by a 90 nm-CMOS miniaturization process.

Figure 2:
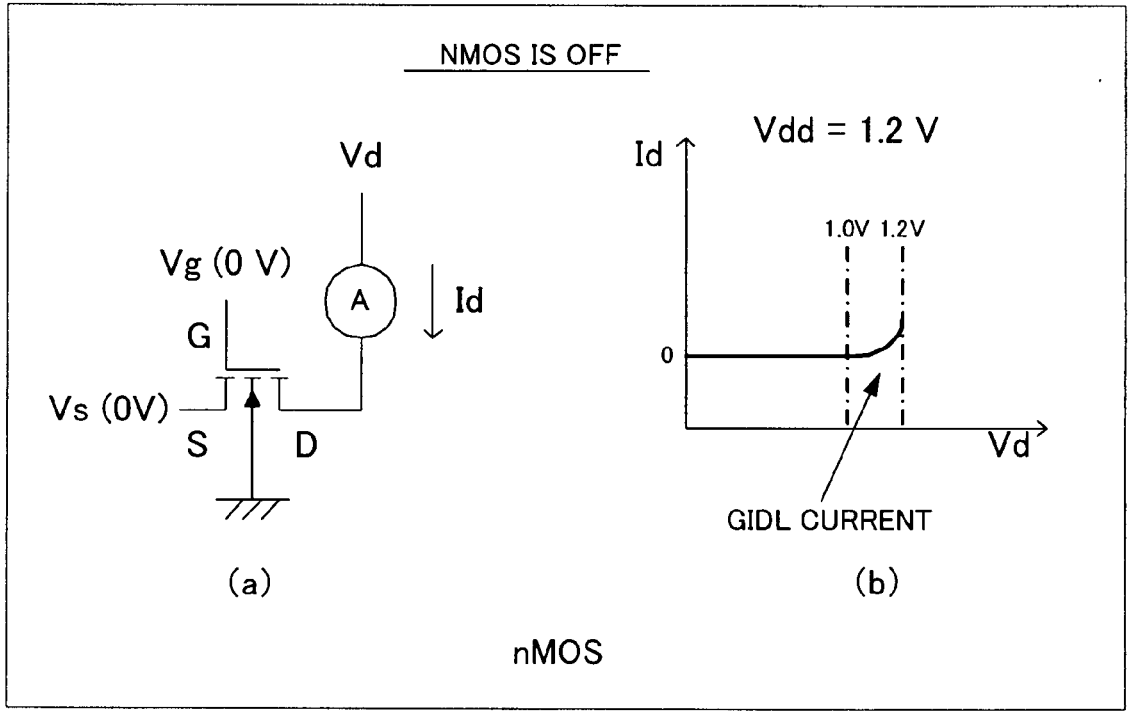
FIG. 2 is a diagram for describing a GIDL current occurring in an nMOS obtained by a 90 nm-CMOS miniaturization process.
Figure 3:
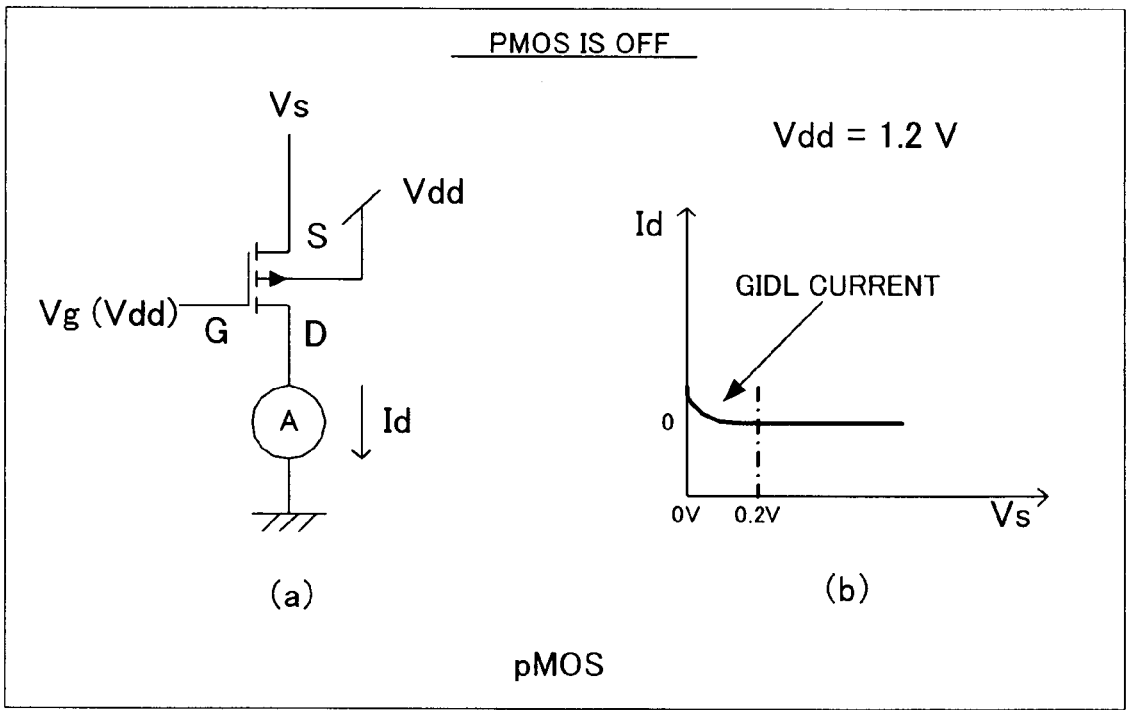
FIG. 3 is a diagram for describing a GIDL current occurring in a pMOS obtained by the 90 nm-CMOS miniaturization process.

FIG. 2 is a diagram for describing a GIDL current occurring in an nMOS obtained by the 90 nm-CMOS miniaturization process. A portion (a) of FIG. 2 is a circuit diagram showing the nMOS when it is OFF. A portion (b) of FIG. 2 is a diagram showing a relationship between GIDL current Id and a drain voltage Vd of the OFF-state nMOS. As shown in the portion (b) of FIG. 2, when the drain voltage Vd of the nMOS is 1.0 V or more, a GIDL current flowing from the drain to the well of the nMOS occurs. FIG. 3 is a diagram for describing a GIDL current occurring in a pMOS obtained by the 90 nm-CMOS miniaturization process. A portion (a) of FIG. 3 is a circuit diagram of the PMOS when it is OFF. A portion (b) of FIG. 3 is a diagram showing a relationship between a GIDL current Id and a source voltage Vs of the OFF-state pMOS. As shown in the portion (b) of FIG. 3, when the source voltage Vs of the pMOS is 0.2 V or less, a GIDL current flowing from the source to the well of the pMOS occurs.

As shown in FIGS. 2 and 3, when the n-ch switch circuit device 100 is configured under the above-described conditions, the switch circuit-ON predetermined low voltage is most preferably 0.2 V, and the switch circuit-OFF predetermined high voltage is most preferably 1.0 V.

(2) Second Example

Figure 4:
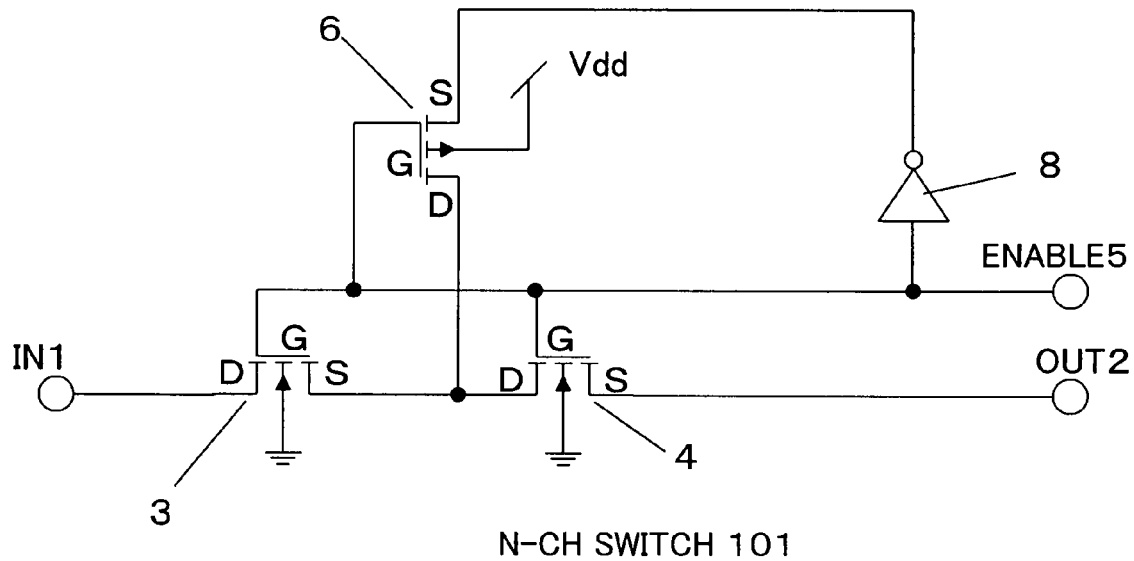
FIG. 4 is a diagram showing a configuration of an n-ch switch circuit device 101 according to a second example of the first embodiment of the present invention.

FIG. 4 is a diagram showing a configuration of an n-ch switch circuit device 101 according to a second example of the first embodiment of the present invention. As shown in FIG. 4, the n-ch switch circuit device 101 has the same configuration as that of the n-ch switch circuit device 100 of the first example (see FIG. 1), except that the voltage changing circuit 7 is replaced with an inverter 8.

Next, an operation of the n-ch switch circuit device 101 will be described. Note that voltages applied to the ENABLE terminal 5 are similar to those in the first example. To turn ON the n-ch switch circuit device 101, a high-level control voltage is applied to the ENABLE terminal 5. Thereby, the nMOS 3 and the nMOS 4 are turn ON, and the PMOS 6 is turned OFF. The inverter 8 applies a low-level voltage obtained by inverting the input high-level voltage to the drain of the PMOS 6.

On the other hand, to turn OFF the n-ch switch circuit device 101, a low-level control voltage is applied to the ENABLE terminal 5. Thereby, the nMOS 3 and the nMOS 4 are turned OFF, and the PMOS 6 is turned ON. The inverter 8 applies a high-level voltage obtained by inverting an input low-level voltage to the drain of the pMOS 6. The high-level voltage is applied via the ON-state PMOS 6 to the connection portion between the source of the nMOS 3 and the drain of the nMOS 4.

As described above, even in the case of a simple circuit configuration in which the voltage changing circuit 7 is replaced with the inverter 8, an effect similar to that of the first example can be obtained.

(3) Third Example

Figure 5:
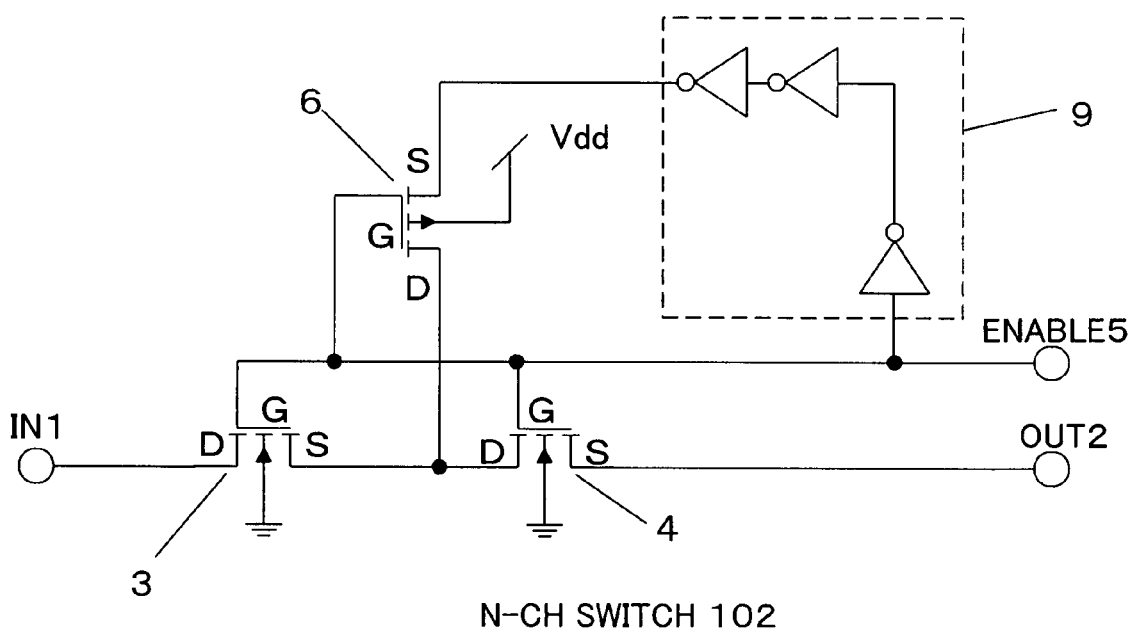
FIG. 5 is a diagram showing a configuration of an n-ch switch circuit device 102 according to a third example of the first embodiment of the present invention.

FIG. 5 is a diagram showing a configuration of an n-ch switch circuit device 102 according to a third example of the first embodiment of the present invention. As shown in FIG. 5, the n-ch switch circuit device 102 has the same configuration as that of the n-ch switch circuit device 101 of the second example, except that the single inverter 8 is replaced with a series circuit 9 including three inverters.

Here, the source and drain of a MOSFET have a parasitic capacitance larger than that of the gate. Therefore, in the n-ch switch circuit device 101 including the single inverter 8, it takes a long time to charge the source or drain of an MOSFET with voltage, which is likely to lead to a reduction in switching speed.

Therefore, by providing the series circuit 9 including three inverters to the n-ch switch circuit device 102, when the n-ch switch circuit device 102 is OFF, the source of the nMOS 3 and the drain of the nMOS 4 can be quickly charged with voltage. Thereby, in the n-ch switch circuit device 102, the reduction in the switching speed can be suppressed.

Although the series circuit 9 including three inverters is added in the above description, any series circuit including an odd number of inverters may be added. Alternatively, instead of inverters, a series circuit including buffers may be added. In this case, the number of buffers may not be odd. Note that, in the series circuit 9 including three inverters, the transistor sizes of the inverters (or buffers) are desirably gradually increased.

(4) Fourth Example

Figure 6:
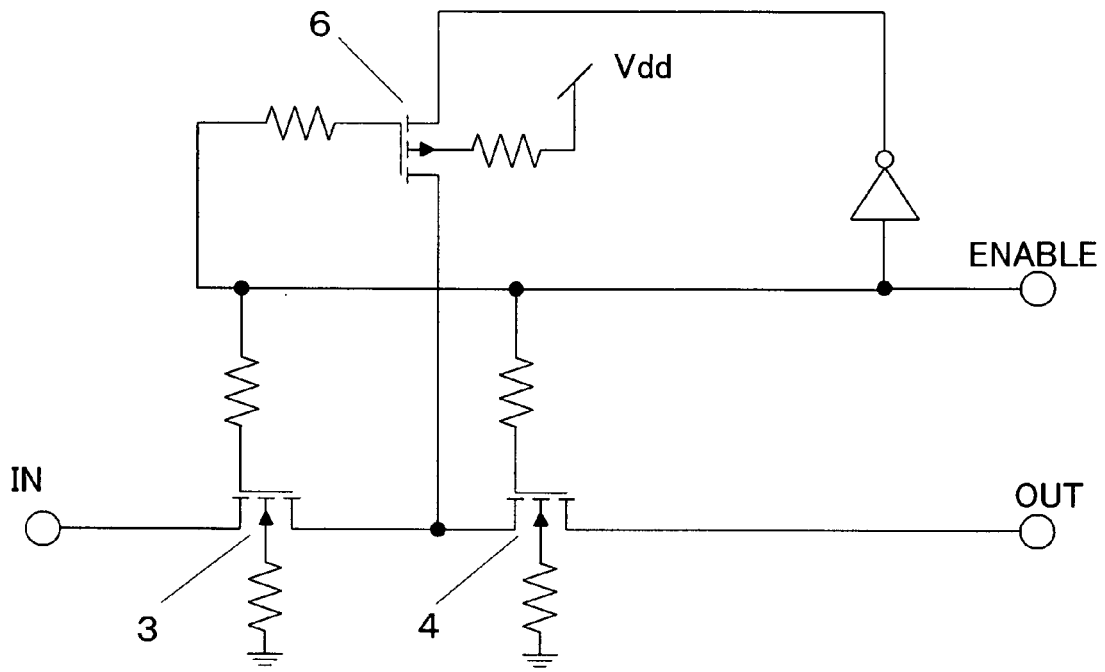
FIG. 6 is a diagram showing a configuration of an n-ch switch circuit device 103 according to a fourth example of the first embodiment of the present invention.

FIG. 6 is a diagram showing a configuration of an n-ch switch circuit device 103 according to a fourth example of the first embodiment of the present invention. As shown in FIG. 6, the n-ch switch circuit device 103 has the same configuration as that of the n-ch switch circuit device 101 of the second example, except that resistors are inserted into the gate and the back gate of each of the nMOS 3, the nMOS 4 and the pMOS 6.

These resistors are provided so that, when the n-ch switch circuit device 101 is used so as to switch a high-frequency signal, the leakage of the high-frequency signal via the parasitic capacitances of the gate and well of a MOSFET, which increases the insertion loss of the ON-state n-ch switch circuit device 101, is suppressed.

Note that, in the switch circuit devices of all the embodiments of the present invention, similarly, by inserting resistors into the gate and back gate of an MOSFET, an increase in insertion loss can be suppressed even when the switch circuit device is used so as to switch a high-frequency signal. Alternatively, a similar effect is obtained even when inductors are inserted into the gate and back gate of an MOSFET instead of resistors.

(5) Fifth Example

Figure 7:
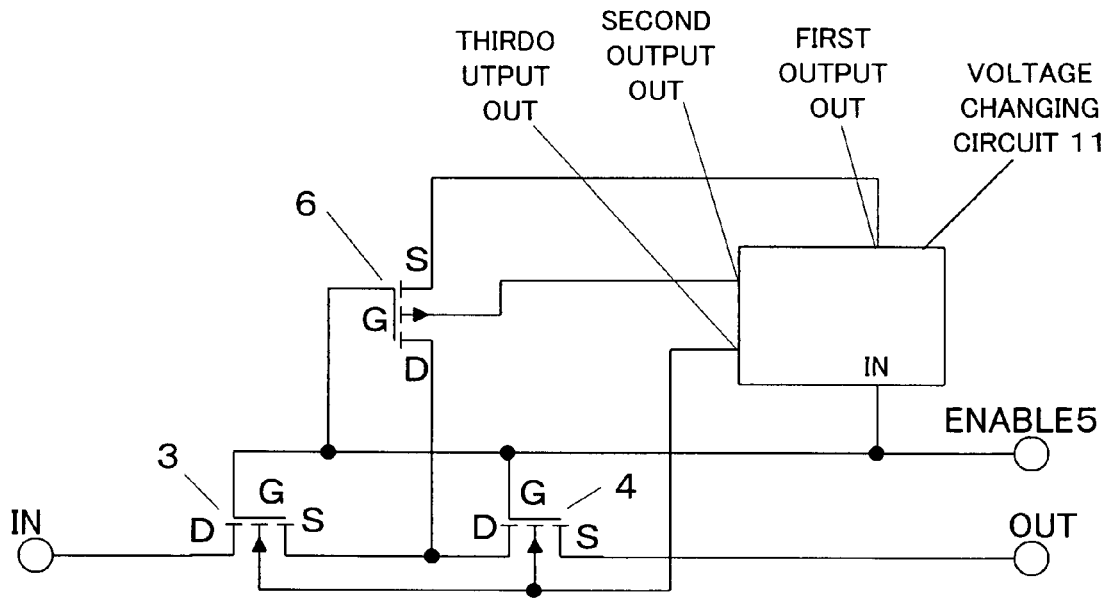
FIG. 7 is a diagram showing a configuration of an n-ch switch circuit device 104 according to a fifth example of the first embodiment of the present invention.

FIG. 7 is a diagram showing a configuration of an n-ch switch circuit device 104 according to a fifth example of the first embodiment of the present invention. As shown in FIG. 7, the n-ch switch circuit device 104 has the same configuration as that of the n-ch switch circuit device 100 of the first example, except that the voltage changing circuit 7 is replaced with a voltage changing circuit 11. The voltage changing circuit 11 has three outputs OUT. The first output OUT is connected to the source of the pMOS 6, the second output OUT is connected to the back gate of the pMOS 6, and the third output OUT is connected to the back gates of the nMOS 3 and the nMOS 4. Note that, as an example, it is here assumed that the power supply voltage Vdd for the n-ch switch circuit device 104 is 1.2 V.

Figure 8:
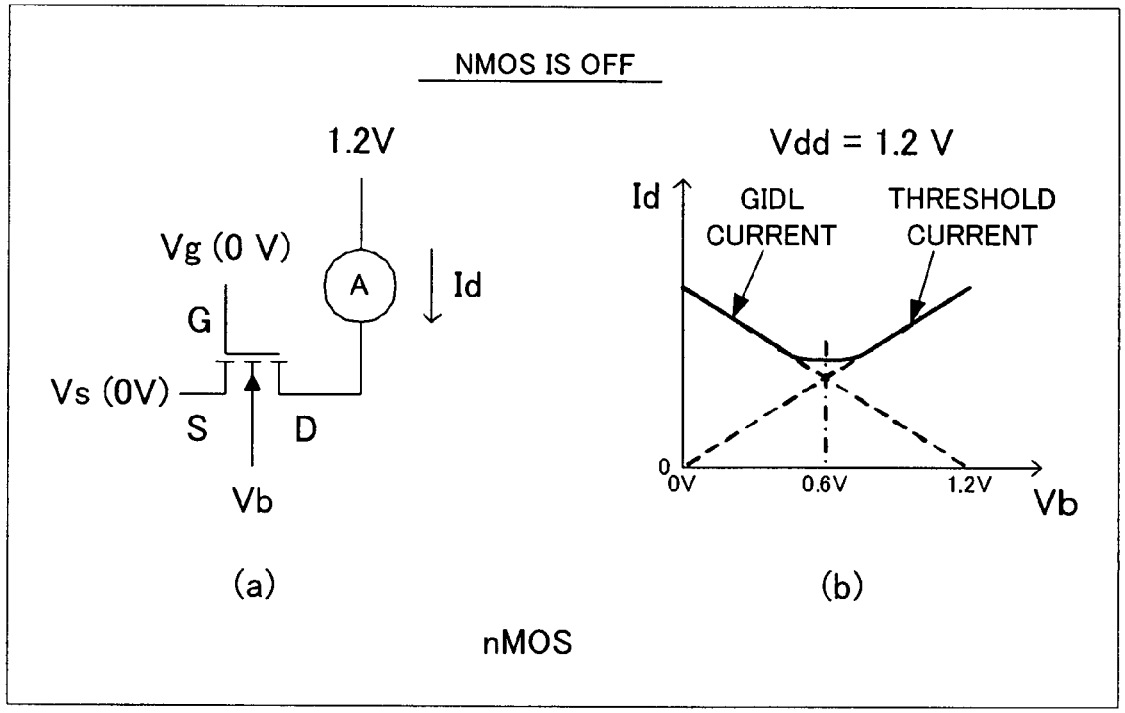
FIG. 8 is a diagram for describing a relationship between a back gate voltage Vb and a leakage current Id of an nMOS obtained by the 90 nm-CMOS miniaturization process.

FIG. 8 is a diagram for describing a relationship between a back gate voltage Vb and a leakage current Id of an nMOS obtained by the 90 nm-CMOS miniaturization process. A portion (a) of FIG. 8 is a circuit diagram of the OFF-state nMOS, where a gate voltage Vg and a source voltage Vs thereof are 0 V and a drain voltage Vd thereof is 1.2 V which is equal to the power supply voltage Vdd. A portion (b) of FIG. 8 is a diagram showing a relationship between the back gate voltage Vb and the leakage current Id of the OFF-state nMOS of the portion (a) of FIG. 8. As shown in the portion (b) of FIG. 8, the leakage current Id of the nMOS of the portion (a) of FIG. 8 is the sum of a GIDL current and a threshold current. As the back gate voltage Vb increases from 0 V to 1.2 V, the GIDL current decreases while the threshold current increases. The leakage current Id is minimum in the vicinity of a point where the back gate voltage Vb is 0.6 V. Note that, when the leakage current Id of the ON-state the nMOS is minimum at a point where the back gate voltage Vb is 0 V.

Figure 9:
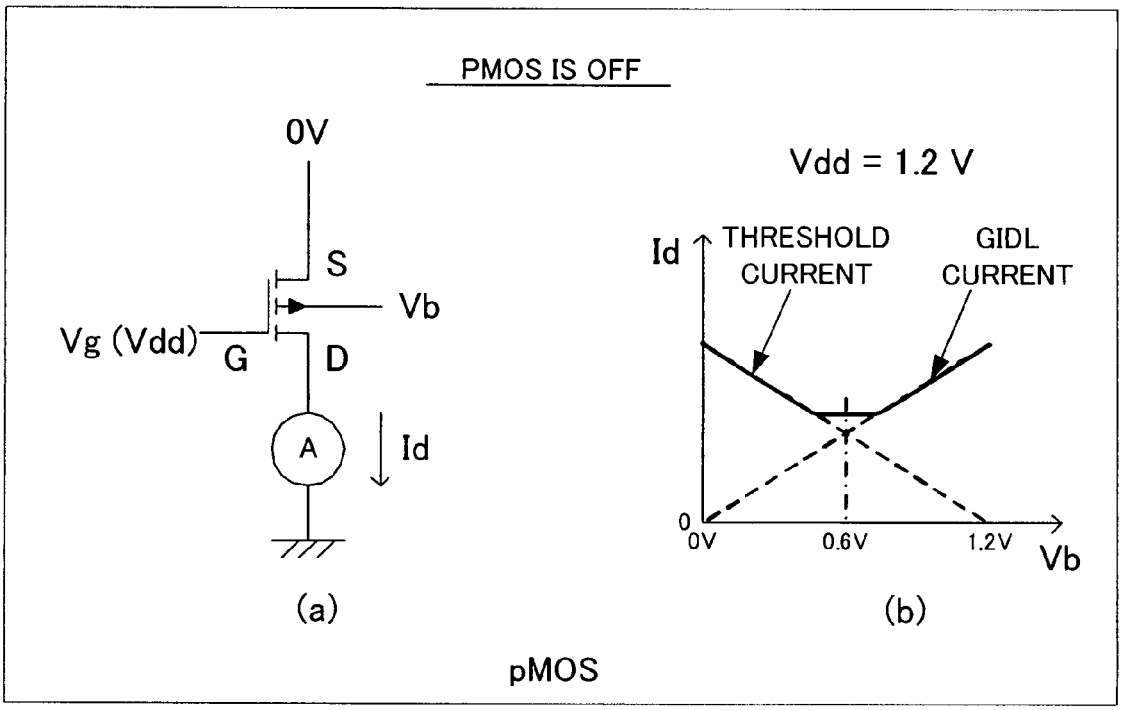
FIG. 9 is a diagram for describing a relationship between a back gate voltage Vb and a leakage current Id of a pMOS obtained by the 90 nm-CMOS miniaturization process.

FIG. 9 is a diagram for describing a relationship between a back gate voltage Vb and a leakage current Id of a pMOS obtained by the 90 nm-CMOS miniaturization process. A portion (a) of FIG. 9 is a circuit diagram of the OFF-state pMOS, where a gate voltage Vg thereof is 1.2 V which is equal to the power supply voltage Vdd, and a source voltage Vs and a drain voltage Vd thereof are 0 V. A portion (b) of FIG. 9 is a diagram showing a relationship between the back gate voltage Vb and a leakage current Id of the OFF-state PMOS of the portion (a) of FIG. 9. As shown in the portion (b) of FIG. 9, the leakage current Id of the PMOS of the portion (a) of FIG. 9 is the sum of a GIDL current and a threshold current. As the back gate voltage Vb increases from 0 V to 1.2 V, the threshold current decreases while the GIDL current increases. The leakage current Id is minimum in the vicinity of a point where the back gate voltage Vb is 0.6 V. Note that the leakage current Id of the ON-state pMOS is minimum at a point where the back gate voltage Vb is 1.2 V.

As can be seen from FIGS. 8 and 9, the leakage current can be reduced by increasing the drain or source potential of an nMOS and decreasing the drain or source potential of a pMOS as described in the first to fourth examples, and in addition, the leakage current can be further reduced by controlling the back gate potential.

Hereinafter, an operation of the n-ch switch circuit device 104 will be described. Control voltages applied to the ENABLE terminal 5 are similar to those in the first example. To turn ON the n-ch switch circuit device 104, a high-level control voltage is applied to the ENABLE terminal 5. Thereby, the nMOS 3 and the nMOS 4 are turned ON, and the pMOS 6 is turned OFF. While a high-level control voltage is applied to the input IN, the voltage changing circuit 11 applies a voltage of 0 V via the first output OUT to the source of the pMOS 6, a voltage of 0.6 V via the second output OUT to the back gate of the PMOS 6 (see FIG. 9), and a voltage of 0 V via the third output OUT to the back gates of the nMOS 3 and the nMOS 4, in synchronization with the OFF operation of the PMOS 6.

By the above-described operation, the leakage currents Id in the nMOS 3 and the nMOS 4 are minimized, and the leakage current Id in the pMOS 6 is minimized, thereby making it possible to reduce the insertion loss of the n-ch switch circuit device 104.

To turn OFF the n-ch switch circuit device 104, a low-level control voltage is applied to the ENABLE terminal 5. Thereby, the nMOS 3 and the nMOS 4 are turned OFF, and the pMOS 6 is turned ON. While a low-level control voltage is applied to the input IN, the voltage changing circuit 11 applies a voltage of 1.2 V via the first output OUT to the source of the pMOS 6 in synchronization with the ON operation of the pMOS 6. The voltage of 1.2 V is applied via the ON-state pMOS 6 to the connection portion between the source of the nMOS 3 and the drain of the nMOS 4. While a low-level control voltage is applied to the input IN, the voltage changing circuit 11 also applies a voltage of 1.2 V via the second output OUT to the back gate of the pMOS 6, and a voltage of 0.6 V via the third output OUT to the back gates of the nMOS 3 and the nMOS 4 (see FIG. 8).

By the above-described operation, the leakage currents Id in the nMOS 3 and the nMOS 4 are minimized, and the leakage current Id in the pMOS 6 is minimized, thereby making it possible to reduce the insertion loss of the n-ch switch circuit device 104.

Although it has been described above that voltages which minimize the leakage currents Id are applied to the back gates of the PMOS 6, the nMOS 3 and the nMOS 4, voltages which cause the leakage currents Id to be smaller than or equal to a predetermined threshold may be applied to the back gates. Here, the predetermined threshold for the leakage current Id is set to be a value at or below which the insertion loss of the ON-state n-ch switch circuit device 104 is caused to be smaller than or equal to a desired value, and secures desired isolation characteristics of the OFF-state n-ch switch circuit device 104.

As described above, the insertion loss of the ON-state n-ch switch circuit device 104 is reduced, and the isolation characteristics of the OFF-state n-ch switch circuit device 104 are improved. In addition, a leakage current (the sum of a GIDL current and a threshold current) can be suppressed, resulting in a reduction in power consumption.

Note that, in the configurations of the n-ch switch circuit devices of the first embodiment described above, a capacitor may be added an end of which is connected to the source of the pMOS 6 and the other end of which is grounded. In this case, it is possible to remove an unnecessary high-frequency component which is otherwise transferred from the source of the PMOS 6 to the ENABLE terminal 5.

Second Embodiment

In a second embodiment, a p-ch switch circuit device in which a pMOS is employed as a switching circuit will be described.

(1) First Example

Figure 10:
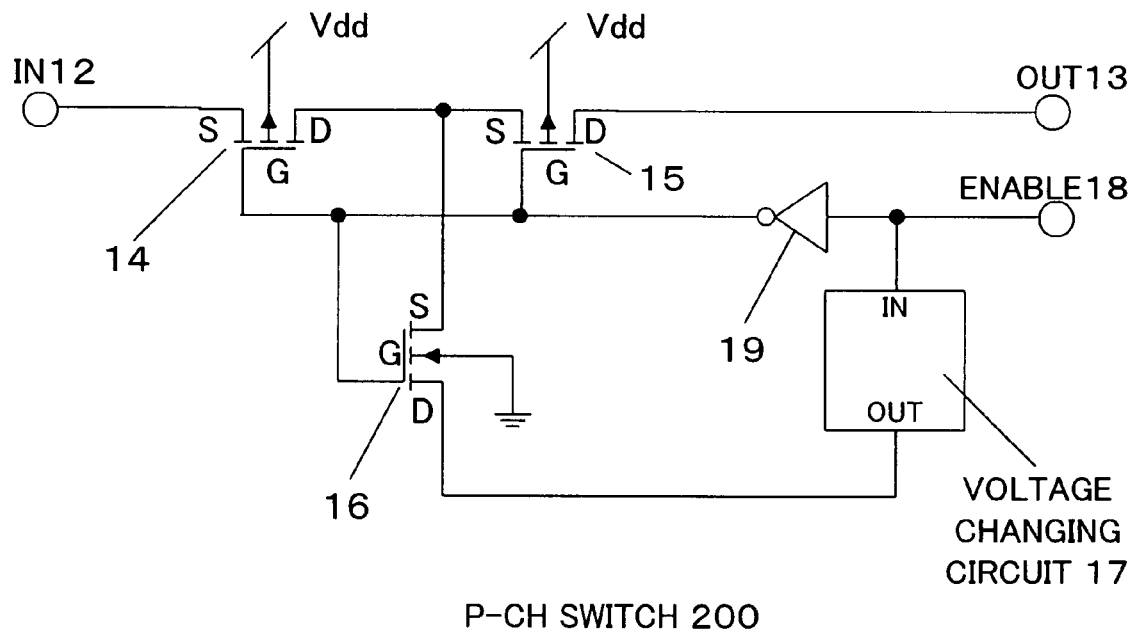
FIG. 10 is a diagram showing a configuration of a p-ch switch circuit device 200 according to a first example of a second embodiment of the present invention.

FIG. 10 is a diagram showing a configuration of a p-ch switch circuit device 200 according to a first example of the second embodiment of the present invention. As shown in FIG. 10, the p-ch switch circuit device 200 of the second example comprises an input terminal 12, an output terminal 13, a pMOS 14, a pMOS 15, an nMOS 16, a voltage changing circuit 17, an ENABLE terminal 18, and an inverter 19. The pMOS 14 and the pMOS 15 are connected in series between the input terminal 12 and the output terminal 13. The source of the pMOS 14 is connected to the input terminal 12, and the drain of the pMOS 14 is connected to the source of the pMOS 15. The drain of the pMOS 15 is connected to the output terminal 13. The gates of the pMOS 14 and the pMOS 15 are both connected to the output of the inverter 19. The input of the inverter 19 is connected to the ENABLE terminal 18. A power supply voltage Vdd is applied to the back gates of the pMOS 14 and the pMOS 15. The source of the nMOS 16 is connected to a portion at which the drain of the pMOS 14 and the source of the pMOS 15 are connected together. The gate of the nMOS 16 is connected to the output of the inverter 19. The drain of the nMOS 16 is connected to an output OUT of the voltage changing circuit 17. The back gate of the nMOS 16 is grounded. An input IN of the voltage changing circuit 17 is connected to the ENABLE terminal 18.

Next, an operation of the p-ch switch circuit device 200 will be described. To turn ON the p-ch switch circuit device 200, a high-level control voltage (e.g., the power supply voltage Vdd) is applied to the ENABLE terminal 18. Thereby, the pMOS 14 and the pMOS 15 are turned ON, and the nMOS 16 is turned OFF. While a high-level control voltage is applied to the input IN, the voltage changing circuit 17 applies a switch circuit-ON predetermined high voltage (a high-level control voltage which causes a GIDL current of the nMOS 16 to be smaller than or equal to a predetermined threshold) via the output OUT to the drain of the nMOS 16 in synchronization with an OFF operation of the nMOS 16. Here, the predetermined threshold for the GIDL current of the nMOS 16 is set to be a value at or below which the insertion loss of the p-ch switch circuit device 200 is caused to be smaller than or equal to a desired value.

By the above-described operation, the drain potential of the nMOS 16 is increased, so that the isolation characteristics of the nMOS 16 are improved. In addition, the GIDL current occurring in the nMOS 16 can be caused to be lower than or equal to the predetermined threshold. Thereby, it is possible to prevent a current input to the input terminal 12 from leaking via the nMOS 16 from the connection portion between the drain of the pMOS 14 and the source of the pMOS 15. As a result, the insertion loss of the p-ch switch circuit device 200 can be reduced.

To turn OFF the p-ch switch circuit device 200, a low-level control voltage (e.g., 0 V) is applied to the ENABLE terminal 18. Thereby, the pMOS 14 and the pMOS 15 are turned OFF, and the nMOS 16 is turned ON. While a low-level control voltage is applied to the input IN, the voltage changing circuit 17 applies via the output OUT to the drain of the nMOS 16 a switch circuit-OFF predetermined low voltage (a low-level voltage which causes GIDL currents of the pMOS 14 and the pMOS 15 to be smaller than or equal to a predetermined threshold) in synchronization with an ON operation of the nMOS 16. Here, the predetermined threshold for the GIDL currents of the pMOS 14 and the pMOS 15 are set to be a value at or below which desired isolation characteristics of the p-ch switch circuit device 200 are secured. The switch circuit-OFF predetermined low voltage is applied via the ON-state nMOS 16 to the connection portion between the drain of the pMOS 14 and the source of the pMOS 15.

By the above-described operation, the drain potential of the pMOS 14 and the source potential of the pMOS 15 are decreased, and in addition, the GIDL currents occurring in the pMOS 14 and the pMOS 15 can be caused to be smaller than or equal to the desired threshold. Thereby, the isolation characteristics of the pMOS 14 and the pMOS 15 are improved.

As described above, the p-ch switch circuit device 200 dynamically changes the drain (or source) potentials of the nMOS 16, the pMOS 14 and the pMOS 15 between when the p-ch switch circuit device 200 is ON and when it is OFF, thereby making it possible to cause the GIDL currents of the nMOS 16, the pMOS 14 and the pMOS 15 to be smaller than or equal to the desired threshold. Thereby, the p-ch switch circuit device 200 can improve the OFF-state isolation characteristics and reduce the ON-state insertion loss, as compared to conventional switch circuit devices.

Here, exemplary settings of the switch circuit-ON predetermined high voltage and the switch circuit-OFF predetermined low voltage will be described. Note that it is assumed that the low-level voltage and the high-level voltage applied to the ENABLE terminal 18 are 0 V and 1.2 V which is equal to the power supply voltage Vdd, respectively. It is also assumed that the nMOS 16, the pMOS 14 and the pMOS 15 are obtained by the 90 nm-CMOS miniaturization process.

As has been described in the first example of the first embodiment with reference to FIGS. 2 and 3, when the p-ch switch circuit device 200 is configured under the above-described conditions, the switch circuit-ON predetermined high voltage is most preferably 1.0 V, and the switch circuit-OFF predetermined low voltage is most preferably 0.2V.

(2) Second Example

Figure 11:
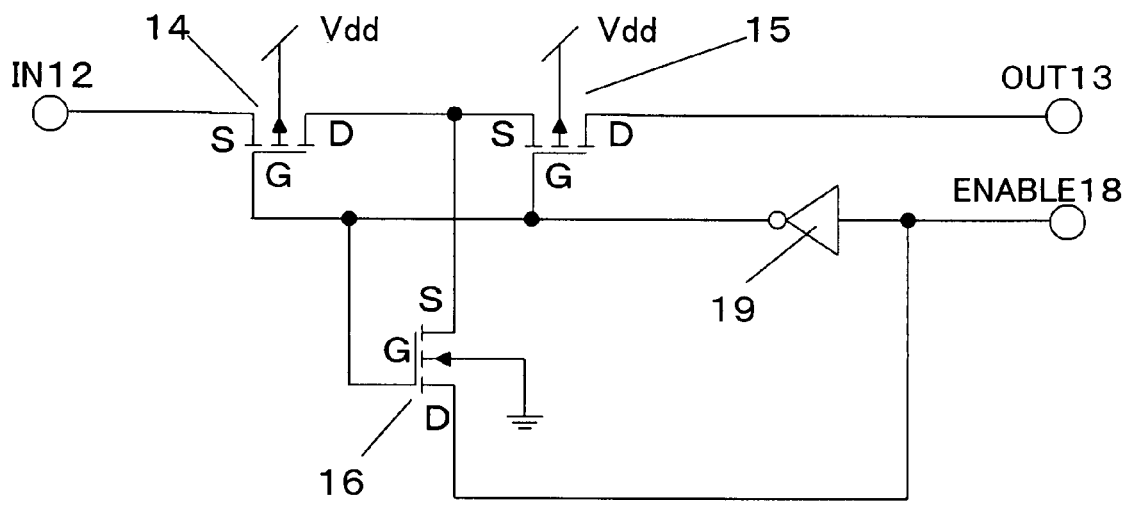
FIG. 11 is a diagram showing a configuration of a p-ch switch circuit device 201 according to a second example of the second embodiment of the present invention.

FIG. 11 is a diagram showing a configuration of a p-ch switch circuit device 201 according to a second example of the second embodiment of the present invention. As shown in FIG. 11, the p-ch switch circuit device 201 has the same configuration as that of the p-ch switch circuit device 200 of the first example (see FIG. 10), except that the voltage changing circuit 17 is not provided.

Next, an operation of the p-ch switch circuit device 201 will be described. Note that voltages applied to the ENABLE terminal 18 are similar to those in the first example. To turn ON the p-ch switch circuit device 201, a high-level control voltage is applied to the ENABLE terminal 18. Thereby, the pMOS 14 and the pMOS 15 are turned ON, and the nMOS 16 is turned OFF.

By the above-described operation, the drain potential of the nMOS 16 is increased, so that the nMOS 16 is turned OFF with improved isolation characteristics. Thereby, it is possible to suppress a current input to the input terminal 12 from leaking via the nMOS 16 from the connection portion between the drain of the pMOS 14 and the source of the pMOS 15. As a result, the insertion loss of the ON-state p-ch switch circuit device 201 can be reduced.

To turn OFF the p-ch switch circuit device 201, a low-level control voltage is applied to the ENABLE terminal 18. Thereby, the pMOS 14 and the pMOS 15 are turned OFF, and the nMOS 16 is turned ON.

By the above-described operation, the drain potential of the pMOS 14 and the source potential of the pMOS 15 are decreased, so that the pMOS 14 and the pMOS 15 are turned OFF with improved isolation characteristics. As a result, the isolation characteristics of the OFF-state p-ch switch circuit device 201 are improved.

As described above, the p-ch switch circuit device 201 can reduce the ON-state insertion loss as compared to conventional p-ch switch circuit devices. Further, the p-ch switch circuit device 201 is different from the p-ch switch circuit device 200 of the first example in that, although the GIDL current may be larger than or equal to the desired threshold, the voltage changing circuit 17 is not provided, and therefore, the p-ch switch circuit device 201 can have a simple circuit configuration.

(3) Third Example

Figure 12:
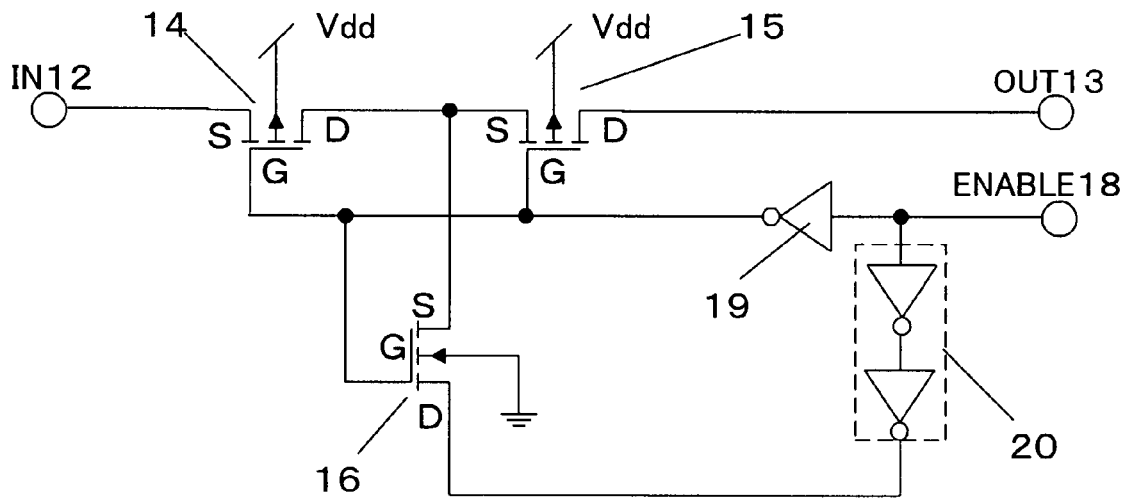
FIG. 12 is a diagram showing a configuration of a p-ch switch circuit device 202 according to a third example of the second embodiment of the present invention.

FIG. 12 is a diagram showing a configuration of a p-ch switch circuit device 202 according to a third example of the second embodiment of the present invention. As shown in FIG. 12, the p-ch switch circuit device 202 has the same configuration as that of the p-ch switch circuit device 201 of the second example, except that a series circuit 20 including two inverters is added. The input of the series circuit 20 is connected to the ENABLE terminal 18, and the output of the series circuit 20 is connected to the drain of the nMOS 16.

With the above-described configuration, a deterioration in switching speed of the p-ch switch circuit device 202 can be suppressed for the same reason as that which has been described in the third example of the first embodiment.

(4) Fourth Example

Figure 13:
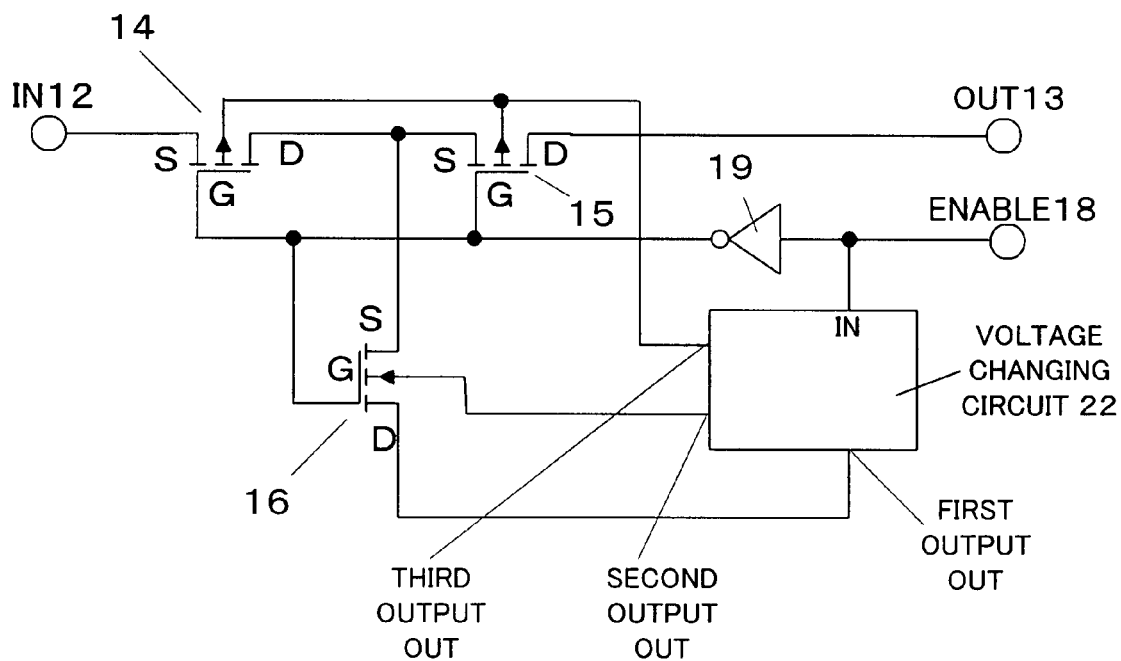
FIG. 13 is a diagram showing a configuration of a p-ch switch circuit device 203 according to a fourth example of the second embodiment of the present invention.

FIG. 13 is a diagram showing a configuration of a p-ch switch circuit device 203 according to a fourth example of the second embodiment of the present invention. As shown in FIG. 13, the p-ch switch circuit device 203 has the same configuration as that of the p-ch switch circuit device 200 of the first example (see FIG. 10), except that the voltage changing circuit 17 is replaced with a voltage changing circuit 22. The voltage changing circuit 22 has three outputs OUT. The first output OUT is connected to the drain of the nMOS 16. The second output OUT is connected to the back gate of the nMOS 16. The third output OUT is connected to the back gates of the pMOS 14 and the pMOS 15.

Hereinafter, an operation of the p-ch switch circuit device 203 will be described. Note that it is assumed that voltages applied to the ENABLE terminal 18 are similar to those in the first example. To turn ON the p-ch switch circuit device 203, a high-level control voltage is applied to the ENABLE terminal 18. Thereby, the pMOS 14 and the pMOS 15 are turned ON, and the nMOS 16 is turned OFF. While a high-level control voltage is applied to the input IN, the voltage changing circuit 22 applies a voltage of 1.2 V via the first output OUT to the drain of the nMOS 16, and a voltage of 0.6 V via the second output OUT to the back gate of the nMOS 16 (see FIG. 8), and a voltage of 1.2 V via the third output OUT to the back gates of the pMOS 14 and the PMOS 15, in synchronization with the OFF operation of the nMOS 16.

By the above-described operation, leakage currents Id in the pMOS 14 and the pMOS 15 are minimized, and a leakage current Id in the nMOS 16 is minimized, thereby making it possible to reduce the insertion loss of the p-ch switch circuit device 203.

To turn OFF the p-ch switch circuit device 203, a low-level control voltage is applied to the ENABLE terminal 18. Thereby, the pMOS 14 and the pMOS 15 are turned OFF, and the nMOS 16 is turned ON. While a low-level control voltage is applied to the input IN, the voltage changing circuit 22 applies a voltage of 0 V via the first output OUT to the drain of the nMOS 16 in synchronization with the ON operation of the nMOS 16. The voltage of 0 V is applied via the ON-state nMOS 16 to the drain of the pMOS 14 and the source of the pMOS 15. While the low-level control voltage is input to the input IN, the voltage changing circuit 22 also applies a voltage of 0 V via the second output OUT to the back gate of the nMOS 16, and applies a voltage of 0.6 V via the third output OUT to the back gates of the pMOS 14 and the pMOS 15 (see FIG. 9).

By the above-described operation, the leakage currents Id in the pMOS 14 and the pMOS 15 are minimized, and the leakage current Id in the nMOS 16 is minimized, thereby making it possible to reduce the insertion loss of the p-ch switch circuit device 203.

Although it has been described above that voltages which minimize the leakage currents Id are applied to the back gates of the nMOS 16, the pMOS 14 and the pMOS 15, voltages which cause the leakage currents Id to be smaller than or equal to a predetermined threshold may be applied to the back gates. Here, the predetermined threshold for the leakage current Id is set to be a value at or below which the insertion loss of the ON-state p-ch switch circuit device 203 is caused to be smaller than or equal to a desired value, and desired isolation characteristics of the OFF-state p-ch switch circuit device 203 are secured.

As described above, in the p-ch switch circuit device 203, the ON-state insertion loss is reduced, the OFF-state isolation characteristics are improved, and the leakage current (the sum of a GIDL current and a threshold current) is suppressed, thereby making it possible to reduce power consumption.

Note that in the configurations of the p-ch switch circuit devices of the second embodiment described above, a capacitor may be added an end of which is connected to the drain of the nMOS 16 and the other end of which is grounded. In this case, it is possible to remove an unnecessary high-frequency component which is otherwise transferred from the drain of the nMOS 16 to the ENABLE terminal 18.

Third Embodiment

In a third embodiment, a transfer gate switch circuit device in which an n-ch switch circuit device and a p-ch switch circuit device are connected in parallel will be described.

(1) First Example

Figure 14:
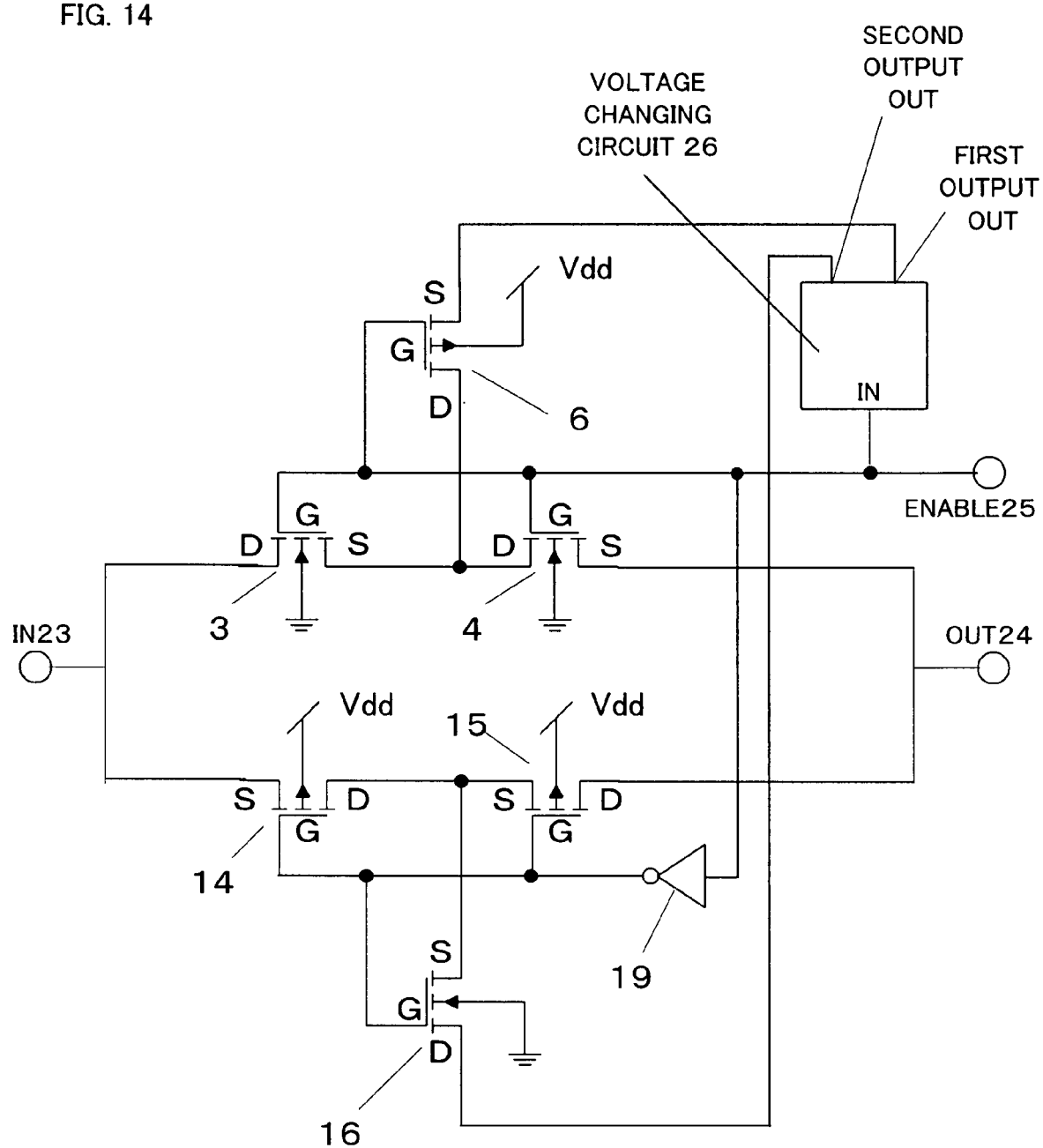
FIG. 14 is a diagram showing a configuration of a transfer gate switch circuit device 300 according to a first example of the third embodiment of the present invention.

FIG. 14 is a diagram showing a configuration of a transfer gate switch circuit device 300 according to a first example of the third embodiment of the present invention. As shown in FIG. 14, the transfer gate switch circuit device 300 has a configuration in which the n-ch switch circuit device 100 of the first example of the first embodiment and the p-ch switch circuit device 200 of the first example of the second embodiment are connected in parallel. In the transfer gate switch circuit device 300, the input terminal 1, the output terminal 2, the ENABLE terminal 5 and the voltage changing circuit 7 of the n-ch switch circuit device 100, and the input terminal 12, the output terminal 13, the ENABLE terminal 18 and the voltage changing circuit 17 of the p-ch switch circuit device 200 are replaced with a common input terminal 23, a common output terminal 24, a common ENABLE terminal 25, and a common voltage changing circuit 26, respectively. Here, the voltage changing circuit 26 has an input connected to the ENABLE terminal 25, a first output OUT connected to the drain of the PMOS 6, and a second output OUT connected to the drain of the nMOS 16.

Here, in the transfer gate switch circuit device 300, the circuit forming the n-ch switch circuit device 100 and the circuit forming the p-ch switch circuit device 200 simultaneously perform the ON/OFF operation. The operation of the circuit forming the n-ch switch circuit device 100 has been described in the first example of the first embodiment, and the operation of the circuit forming the p-ch switch circuit device 200 has been described in the first example of the second embodiment, and therefore, the operations of these circuits will not be described in detail.

Note that the voltage changing circuit 26 uses the first output OUT to perform the same operation as the operation which is performed by the voltage changing circuit 7 of the n-ch switch circuit device 100 using the output OUT. The voltage changing circuit 26 uses the second output OUT to perform the same operation as the operation which is performed by the voltage changing circuit 17 of the p-ch switch circuit device 200 using the output OUT.

By the above-described operation, in the transfer gate switch circuit device 300, the ON-state insertion loss is reduced, the OFF-state isolation characteristics are improved, and the GIDL current is caused to be smaller than or equal to a predetermined threshold, thereby making it possible to suppress an increase in power consumption.

Note that, in general, n-ch switch circuit devices are employed when the signal line voltage is relatively low, p-ch switch circuit device are employed when the signal line voltage is relatively high, and transfer gate circuit devices are employed when the signal line voltage is within a wide range, such as the range of 0 to the power supply voltage Vdd or the like.

Alternatively, the transfer gate switch circuit device 300 may have a configuration in which the back gate potential of each MOSFET is controlled to further reduce a leakage current, as in the n-ch switch circuit device 104 (see FIG. 7) of the fifth example of the first embodiment and the p-ch switch circuit device 203 (see FIG. 13) of the fourth example of the second embodiment.

(2) Second Example

Figure 15:
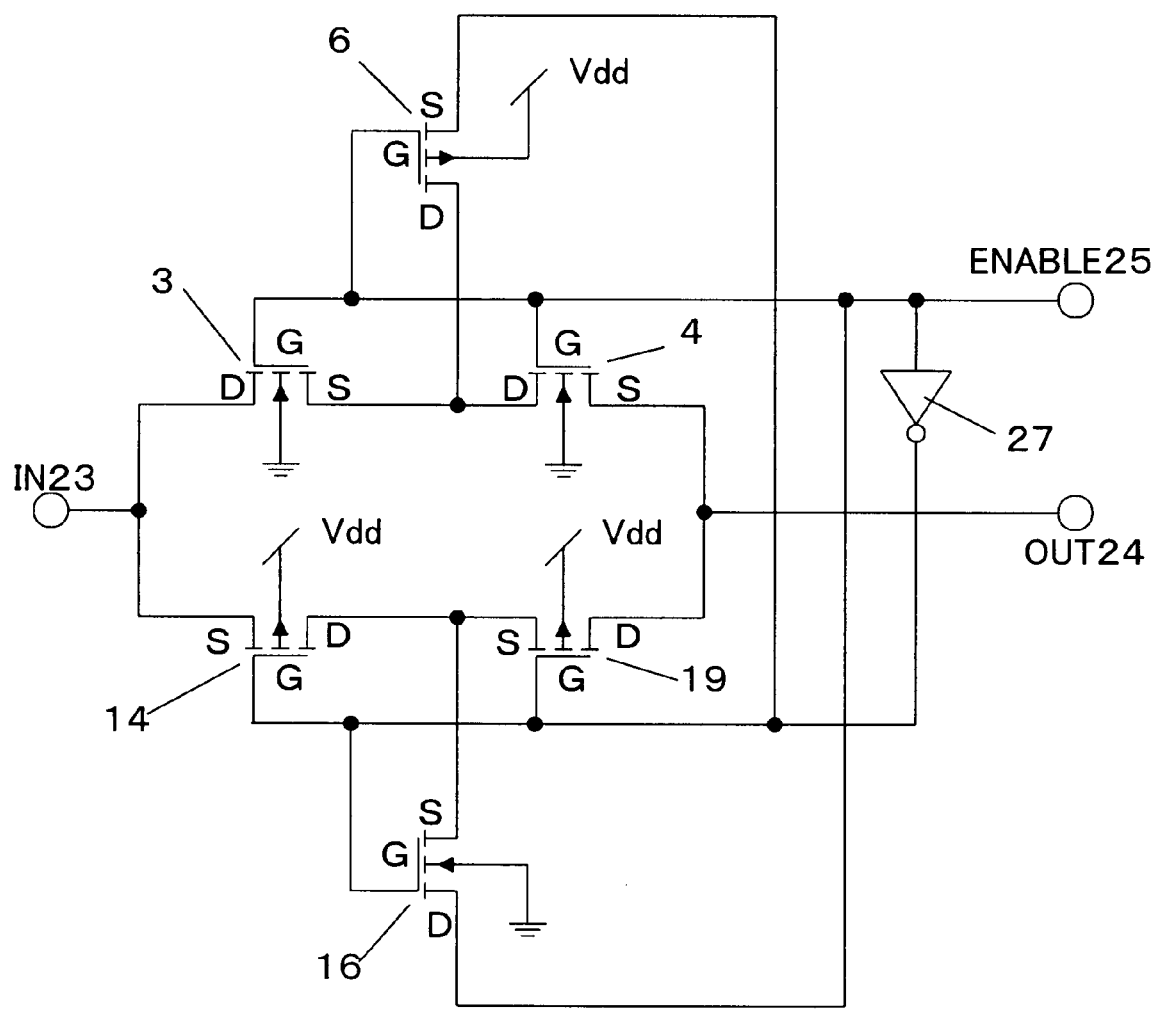
FIG. 15 is a diagram showing a configuration of a transfer gate switch circuit device 301 according to a second example of the third embodiment of the present invention.

FIG. 15 is a diagram showing a configuration of a transfer gate switch circuit device 301 according to a second example of the third embodiment of the present invention. As shown in FIG. 15, in the transfer gate switch circuit device 301, the n-ch switch circuit device 101 (see FIG. 4) of the second example of the first embodiment and the p-ch switch circuit device 201 (see FIG. 11) of the second example of the second embodiment are connected in parallel. In the transfer gate switch circuit device 301, the input terminal 1, the output terminal 2, the ENABLE terminal 5 and the inverter 8 of the n-ch switch circuit device 101, and the input terminal 12, the output terminal 13, the ENABLE terminal 18 and the inverter 19 of the p-ch switch circuit device 201 are replaced with a common input terminal 23, a common output terminal 24, a common ENABLE terminal 25, and an inverter 27, respectively.

Here, in the transfer gate switch circuit device 301, the circuit forming the n-ch switch circuit device 101 and the circuit forming the p-ch switch circuit device 201 simultaneously perform the ON/OFF operation. The operation of the circuit forming the n-ch switch circuit device 101 has been described in the second example of the first embodiment and the operation of the circuit forming the p-ch switch circuit device 201 has been described in the second example of the second embodiment, and therefore, the operations of these circuits will not be described in detail.

As described above, even if the voltage changing circuit 26 is replaced with the inverter 27 to provide a simple circuit configuration, an effect similar to that of the first example can be provided.

Note that the transfer gate switch circuit device 301 may further comprise an inverter or the like to suppress a deterioration in switching speed, as in the n-ch switch circuit device 102 (see FIG. 5) of the third example of the first embodiment and the p-ch switch circuit device 202 (see FIG. 12) of the third example of the second embodiment.

Fourth Embodiment

In a fourth embodiment, an n-ch switch circuit device which employs an nMOS as a switching circuit and in which, when the n-ch switch circuit device is OFF, the isolation characteristics are improved by increasing both the drain and source potentials of the nMOS, will be described.

Figure 16:
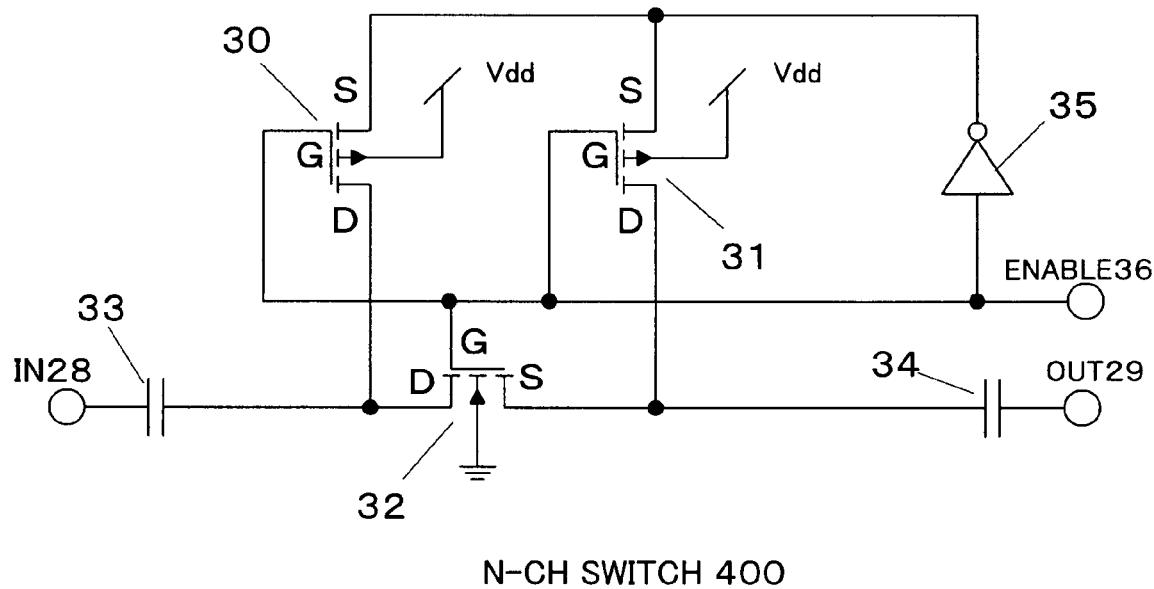
FIG. 16 is a diagram showing a configuration of an n-ch switch circuit device 400 according to a fourth embodiment of the present invention.

FIG. 16 is a diagram showing an n-ch switch circuit device 400 according to the fourth embodiment of the present invention. As shown in FIG. 16, the n-ch switch circuit device 400 comprises an input terminal 28, an output terminal 29, a pMOS 30, a PMOS 31, an nMOS 32, a capacitor 33, a capacitor 34, an inverter 35, and an ENABLE terminal 36. The input terminal 28 is connected to the input of the capacitor 33. The output of the capacitor 33 is connected to the drain of the nMOS 32. The source of the nMOS 32 is connected to the input of the capacitor 34. The back gate of the nMOS 32 is grounded. The output of the capacitor 34 is connected to the output terminal 29. The ENABLE terminal 36 is connected to the gate of the nMOS 32, the gate of the pMOS 30, and the gate of the pMOS 31. The drain of the PMOS 30 is connected to the drain of the nMOS 32. The drain of the pMOS 31 is connected to the source of the nMOS 32. A power supply voltage Vdd is applied to the back gate of each of the pMOS 30 and the pMOS 31. The input of the inverter 35 is connected to the ENABLE terminal 36, and the output of the inverter 35 is connected to the source of the pMOS 30 and the source of the pMOS 31.

Next, an operation of the n-ch switch circuit device 400 will be described. Note that, hereinafter, as an example, it is assumed that a low-level control voltage and a high-level control voltage applied to the ENABLE terminal 36 are 0 V and 1.2 V which is equal to the power supply voltage Vdd, respectively.

To turn ON the n-ch switch circuit device 400, a high-level control voltage is applied to the ENABLE terminal 36. Thereby, the nMOS 32 is turned ON, and the pMOS 30 and the pMOS 31 are turned OFF. The inverter 35 applies a low-level voltage obtained by inverting the input high-level voltage to the sources of the pMOS 30 and the pMOS 31.

By the above-described operation, the isolation characteristics of the pMOS 30 and the pMOS 31 are improved. Specifically, when the n-ch switch circuit device 400 is ON, the pMOS 30 and the PMOS 31 connected in parallel are turned OFF with improved isolation characteristics. Thereby, it is possible to prevent a current input to the input terminal 28 from leaking via the pMOS 30 and the pMOS 31 from the drain and source of the nMOS 32. As a result, the insertion loss of the ON-state n-ch switch circuit device 400 can be reduced.

To turn OFF the n-ch switch circuit device 400, a low-level control voltage is applied to the ENABLE terminal 36. Thereby, the nMOS 32 is turned OFF, and the pMOS 30 and the pMOS 31 are turned ON. The low-level control voltage is also applied to the input of the inverter 35, so that the inverter 35 applies a high-level voltage obtained by inverting the input low-level voltage to the sources of the PMOS 30 and the PMOS 31. The high-level voltage is applied via the ON-state pMOS 30 and pMOS 31 to the drain and source of the nMOS 32.

By the above-described operation, the drain and source potentials of the nMOS 32 are increased, thereby improving the isolation characteristics of the nMOS 32.

As described above, in the n-ch switch circuit device 400, the ON-state insertion loss can be reduced and the OFF-state isolation characteristics can be improved, as compared to conventional n-ch switch circuit devices. In addition, as compared to the n-ch switch circuit device 101 of the second example of the first embodiment, the drain and source potentials of an nMOS are increased, thereby making it possible to further improve the isolation characteristics.

Note that, in the configuration of the n-ch switch circuit device 400, the voltage changing circuit 7 (see FIG. 1) of the first example of the first embodiment may be employed instead of the inverter 35 to apply a switch circuit-ON predetermined low voltage and a switch circuit-OFF predetermined high voltage to the sources of the pMOS 30 and the PMOS 31, thereby suppressing a GIDL current. Alternatively, the voltage changing circuit 11 (see FIG. 7) of the fifth example of the first embodiment may be employed to control the back gate potential of each of the pMOS 30, the pMOS 31 and the nMOS 32, thereby further reducing the leakage current.

In the configuration of the n-ch switch circuit device of the fourth embodiment described above, a capacitor may be added an end of which is connected to the sources of the pMOS 30 and the pMOS 31 and the other end of which is grounded. In this case, it is possible to remove an unnecessary high-frequency component which is otherwise transferred from the sources of the pMOS 30 and the PMOS 31 to the ENABLE terminal 36.

Fifth Embodiment

In a fifth embodiment, a p-ch switch circuit device which employs a pMOS as a switching circuit and in which, when the p-ch switch circuit device is OFF, the isolation characteristics are improved by increasing both the drain and source potentials of the pMOS, will be described.

Figure 17:
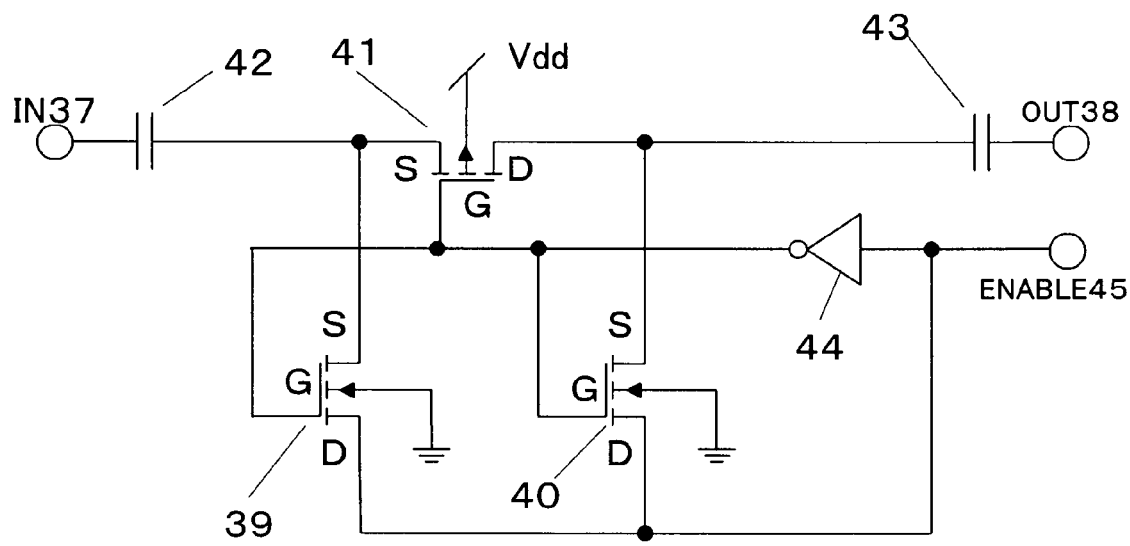
FIG. 17 is a diagram showing a configuration of a p-ch switch circuit device 500 according to a fifth embodiment of the present invention.

FIG. 17 is a diagram showing a configuration of a p-ch switch circuit device 500 according to the fifth embodiment of the present invention. As shown in FIG. 17, the p-ch switch circuit device 500 comprises an input terminal 37, an output terminal 38, an nMOS 39, an nMOS 40, a PMOS 41, a capacitor 42, a capacitor 43, an inverter 44, and an ENABLE terminal 45. The input terminal 37 is connected to the input of the capacitor 42. The output of the capacitor 42 is connected to the source of the pMOS 41. The drain of the pMOS 41 is connected to the input of the capacitor 43. A power supply voltage Vdd is applied to the back gate of the pMOS 41. The output of the capacitor 43 is connected to the output terminal 38. The ENABLE terminal 45 is connected to the drains of the nMOS 39 and the nMOS 40. The source of the nMOS 39 is connected to the source of the pMOS 41. The source of the nMOS 40 is connected to the drain of the pMOS 41. The back gates of the nMOS 39 and the nMOS 40 are grounded. The input of the inverter 44 is connected to the ENABLE terminal 45, and the output of the inverter 44 is connected to the gates of the nMOS 39, the nMOS 40 and the pMOS 41.

Next, an operation of the p-ch switch circuit device 500 will be described. Note that control voltages applied to the ENABLE terminal 45 are similar to those in the fourth embodiment. To turn ON the p-ch switch circuit device 500, a high-level control voltage is applied to the ENABLE terminal 45. Thereby, the pMOS 41 is turned ON, and the nMOS 39 and the nMOS 40 are turned OFF.

By the above-described operation, when the p-ch switch circuit device 500 is ON, a high-level voltage is applied to the drains of the nMOS 39 and the nMOS 40, so that the nMOS 39 and the nMOS 40 are turned OFF with improved isolation characteristics. Thereby, it is possible to reduce the leakage of a current input to the input terminal 37 via the nMOS 39 and the nMOS 40 from the source and drain of the pMOS 41. As a result, the insertion loss of the p-ch switch circuit device 500 can be reduced.

To turn OFF the p-ch switch circuit device 500, a low-level control voltage is applied to the ENABLE terminal 45. Thereby, the pMOS 41 is turned OFF, and the nMOS 39 and the nMOS 40 are turned ON. A low-level voltage is applied to the source and drain of the pMOS 41.

By the above-described operation, when the p-ch switch circuit device 500 is OFF, the isolation characteristics of the pMOS 41 are improved, so that the isolation characteristics of the p-ch switch circuit device 500 are also improved.

As described above, in the p-ch switch circuit device 500, the ON-state insertion loss can be reduced as compared to conventional p-ch switch circuit devices. In addition, as compared to the p-ch switch circuit device 201 of the second example of the second embodiment, the drain and source potentials of a PMOS are decreased, thereby making it possible to further improve the isolation characteristics.

Note that, in the configuration of the p-ch switch circuit device 500, the voltage changing circuit 17 of the first example of the second embodiment (see FIG. 10) may be added, and a switch circuit-ON predetermined high voltage and a switch circuit-OFF predetermined low voltage may be applied to the drains of the nMOS 39 and the nMOS 40, thereby suppressing the occurrence of a GIDL current. Alternatively, the voltage changing circuit 22 of the fourth example of the second embodiment (see FIG. 13) may be employed to control the back gate potential of each of the nMOS 39, the nMOS 40 and the PMOS 41, thereby further reducing the leakage current.

Also, in the configuration of the p-ch switch circuit device of the fifth embodiment described above, a capacitor may be added an end of which is connected to the drains of the nMOS 39 and the nMOS 40 and the other end of which is grounded. Thereby, it is possible to remove an unnecessary high-frequency component which is otherwise transferred from the drains of the nMOS 39 and the nMOS 40 to the ENABLE terminal 45.

Sixth Embodiment

In a sixth embodiment, a transfer gate switch circuit device 600 in which the n-ch switch circuit device 400 of the fourth embodiment and the p-ch switch circuit device 500 of the fifth embodiment are connected in parallel, will be described.

Figure 18:
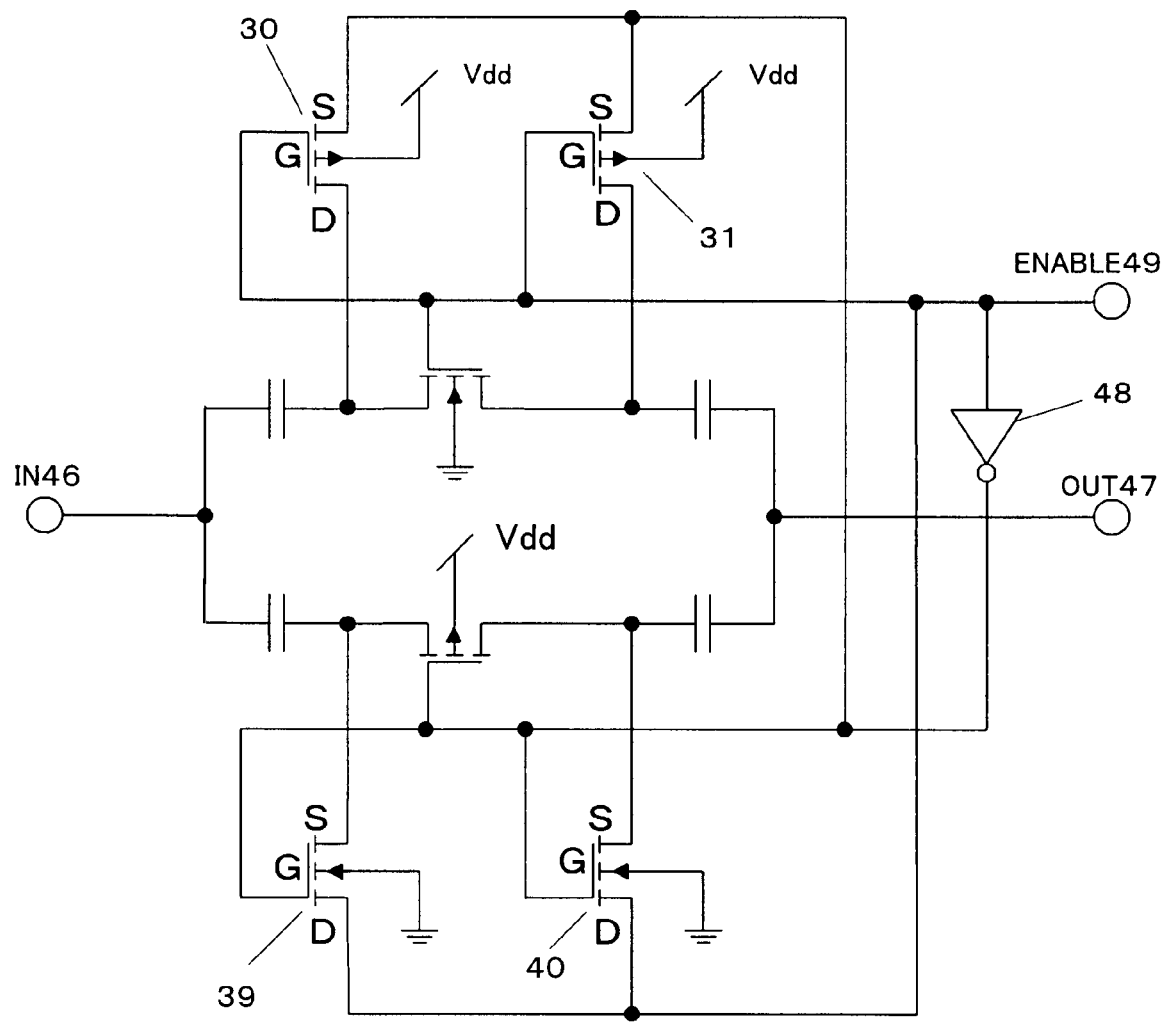
FIG. 18 is a diagram showing a configuration of the transfer gate switch circuit device 600 according to a sixth embodiment of the present invention.

FIG. 18 is a diagram showing a configuration of the transfer gate switch circuit device 600 of the sixth embodiment of the present invention. As shown in FIG. 18, in the transfer gate switch circuit device 600, the input terminal 28, the output terminal 29, the ENABLE terminal 36 and the inverter 35 of the n-ch switch circuit device 400, and the input terminal 37, the output terminal 38, the ENABLE terminal 45 and the inverter 44 of the p-ch switch circuit device 500 are replaced with a common input terminal 46, a common output terminal 47, a common ENABLE terminal 49, and a common inverter 48, respectively.

As has been described in the fourth and fifth embodiments, in the transfer gate switch circuit device 600, the ON-state insertion loss can be reduced and the OFF-state isolation characteristics can be improved as compared to conventional devices.

Note that, in the configuration of the transfer gate switch circuit device 600, the voltage changing circuit 26 of the first example of the third embodiment (see FIG. 14) may be added to control a voltage applied to the sources of the pMOS 30 and the PMOS 31 and the drains of the nMOS 39 and the nMOS 40, thereby reducing the GIDL current. In addition, the back gate potential of each MOSFET may be controlled, thereby further reducing the leakage current.

(Embodiment of Wireless Circuit)

Figure 19:
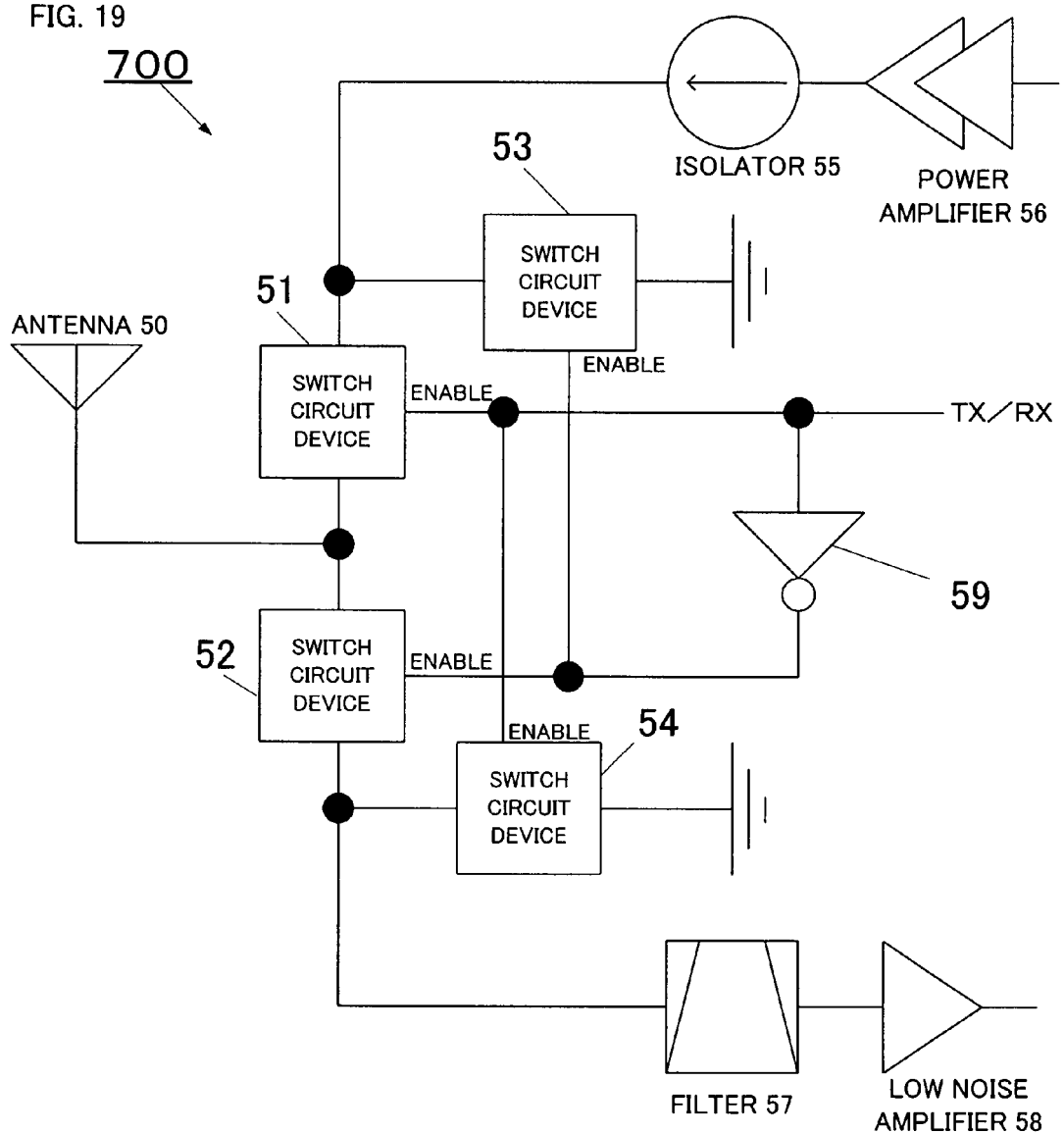
FIG. 19 is a diagram showing a configuration of a wireless circuit device 700 according to an embodiment of the present invention.

In this embodiment, a wireless circuit device employing any of the switch circuit devices of the first to sixth embodiments of the present invention will be described. FIG. 19 is a diagram showing a configuration of a wireless circuit device 700 according to this embodiment of the present invention. The wireless circuit device 700 comprises an antenna 50, switch circuit devices 51, 52, 53 and 54, an isolator 55, a power amplifier 56, a filter 57, a low-noise amplifier 58, and an inverter 59. The switch circuit devices 51, 52, 53 and 54 are any of the switch circuit devices of the first to sixth embodiments of the present invention.

Hereinafter, an operation of the wireless circuit device 700 will be described. When the wireless circuit device 700 performs transmission, an input is supplied to the ENABLE of each switch circuit device so that the switch circuit device 53 is turned OFF, the switch circuit device 51 is turned ON, the switch circuit device 52 is turned OFF, and the switch circuit device 54 is turned ON. Thereby, it is possible to reduce loss of a transmission signal which is caused by leakage of the transmission signal to a reception circuit (the filter 57 and the low-noise amplifier 58).

On the other hand, when the wireless circuit device 700 performs reception, an input is supplied to the ENABLE of each switch circuit device so that the switch circuit device 53 is turned ON, the switch circuit device 51 is turned OFF, the switch circuit device 52 is turned ON, and the switch circuit device 54 is turned OFF. Thereby, it is possible to reduce loss of a reception signal, i.e., a deterioration in noise characteristics, which is caused by leakage of the reception signal to a transmission circuit.

As described above, since the wireless circuit device 700 employs any of the switch circuit devices of the first to sixth embodiments of the present invention, the insertion loss of the ON-state switch circuit device is small and the isolation characteristics of the OFF-state switch circuit device are improved, resulting in small loss of a transmission signal and a small deterioration in reception sensitivity due to the loss.

(Embodiment of Sampling Circuit)

In this embodiment, a sampling circuit employing any of the switch circuit devices of the first to sixth embodiments of the present invention will be described. Note that the operation of each sampling circuit is commonly known and will not be described in detail.

Figure 20:
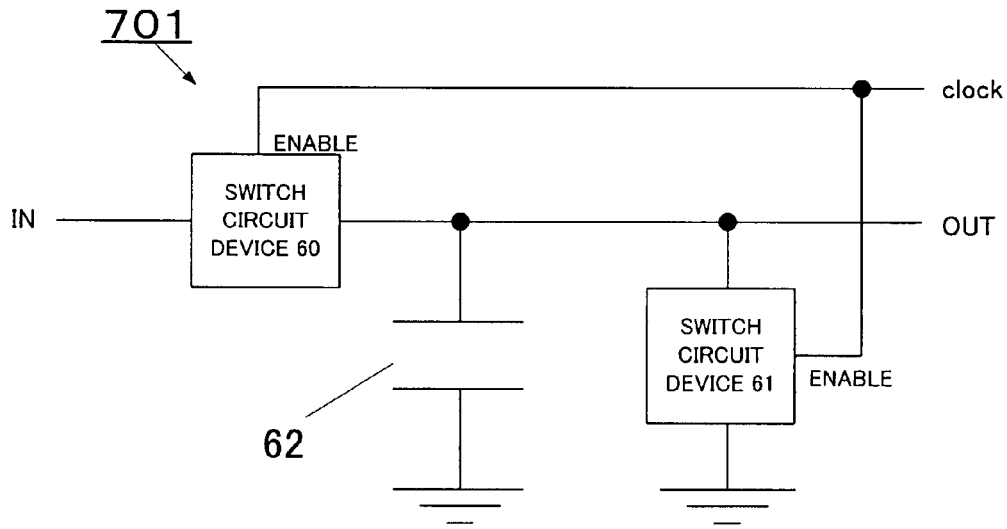
FIG. 20 is a diagram showing a sampling circuit 701 according to an embodiment of the present invention.

FIG. 20 is a diagram showing a sampling circuit 701 according to this embodiment of the present invention. Hereinafter, an operation of the sampling circuit 701 will be briefly described. Initially, a switch circuit device 60 is turned ON, and a switch circuit device 61 is turned OFF. Next, the switch circuit device 60 is turned OFF. Thereby, an input voltage value is sampled by a capacitor 62. Next, by turning ON the switch circuit device 61, the charge of the capacitor 62 is reset. Finally, the switch circuit device 61 is turned OFF and the switch circuit device 60 is turned ON, whereby the sampling circuit 701 returns to the initial state.

Figure 21:
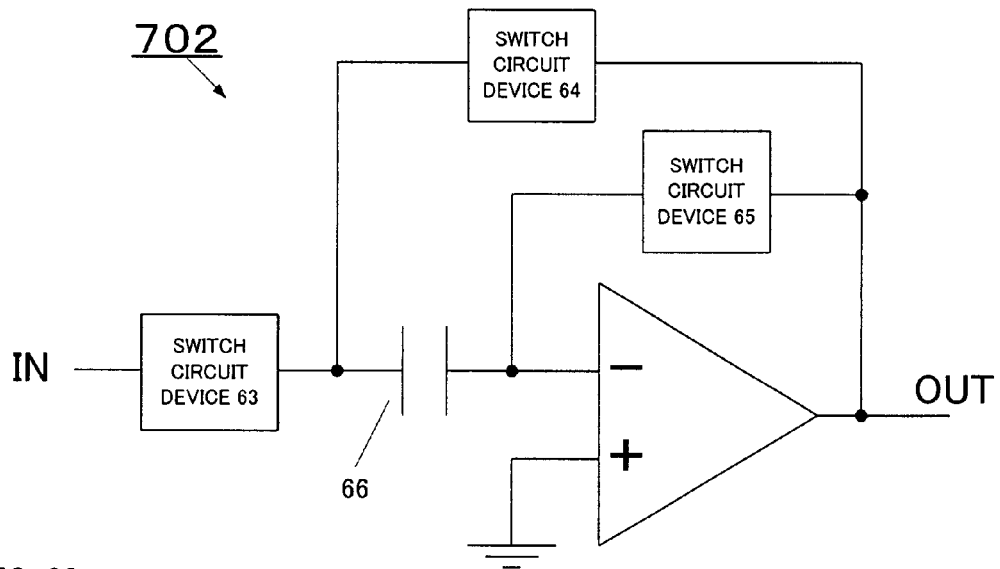
FIG. 21 is a diagram showing a unity gain sampling circuit 702 as an embodiment of the sampling circuit of the present invention.

FIG. 21 is a diagram showing a unity gain sampling circuit 702 as an embodiment of the sampling circuit of the present invention. An operation of the unity gain sampling circuit 702 will be briefly described. Initially, switch circuit devices 63 and 65 are turned ON and a switch circuit device 64 is turned OFF. Thereby, a capacitor 66 is charged with an input signal. Next, the switch circuit devices 63 and 65 are turned OFF and the switch circuit device 64 is turned ON. Thereby, the voltage of the charged capacitor 66 is held.

Figure 22:
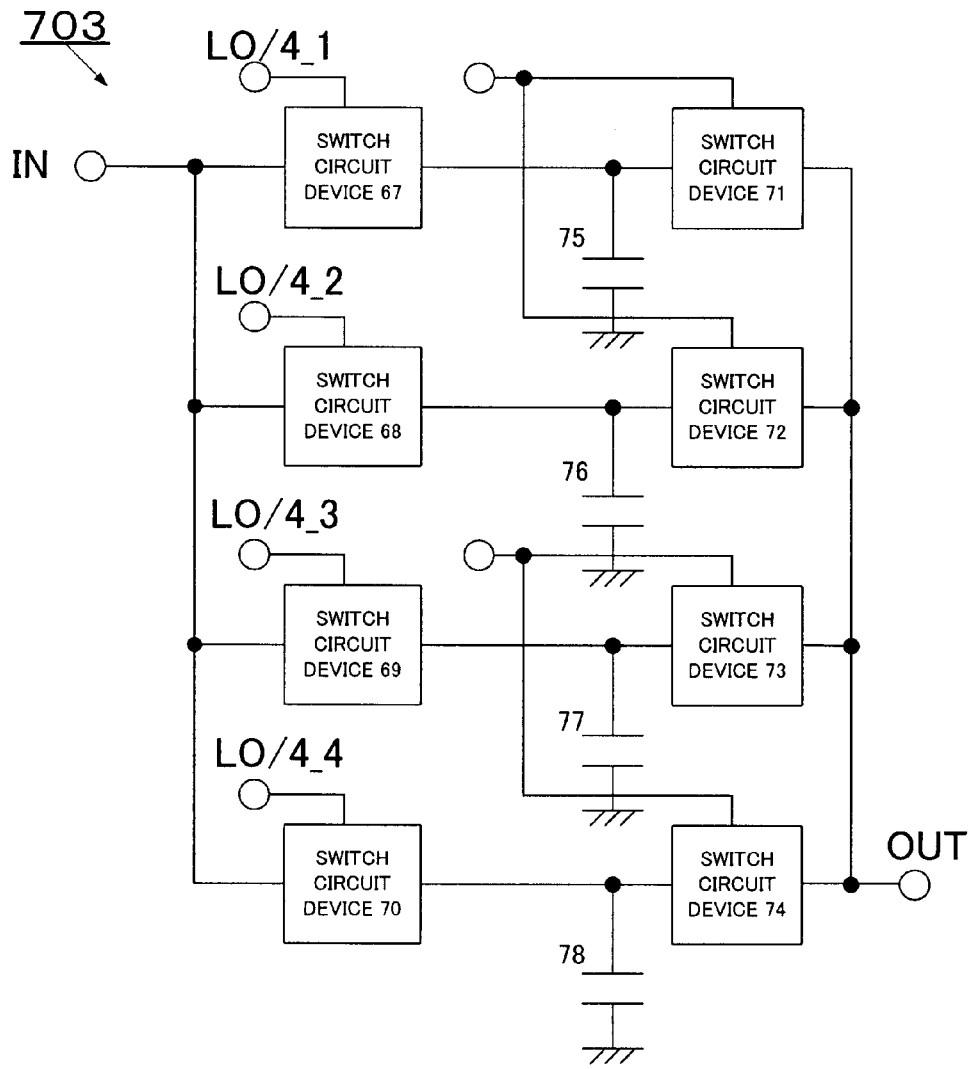
FIG. 22 is a diagram showing a charge sampling filter circuit 703 as an embodiment of the sampling circuit of the present invention.
Figure 23:
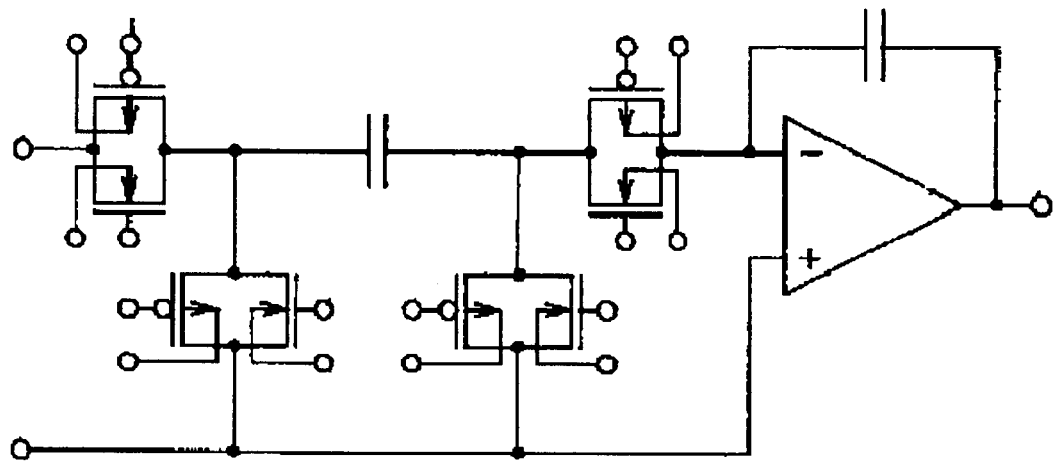
FIG. 23 is a diagram showing a conventional switch circuit device.
Figure 24:
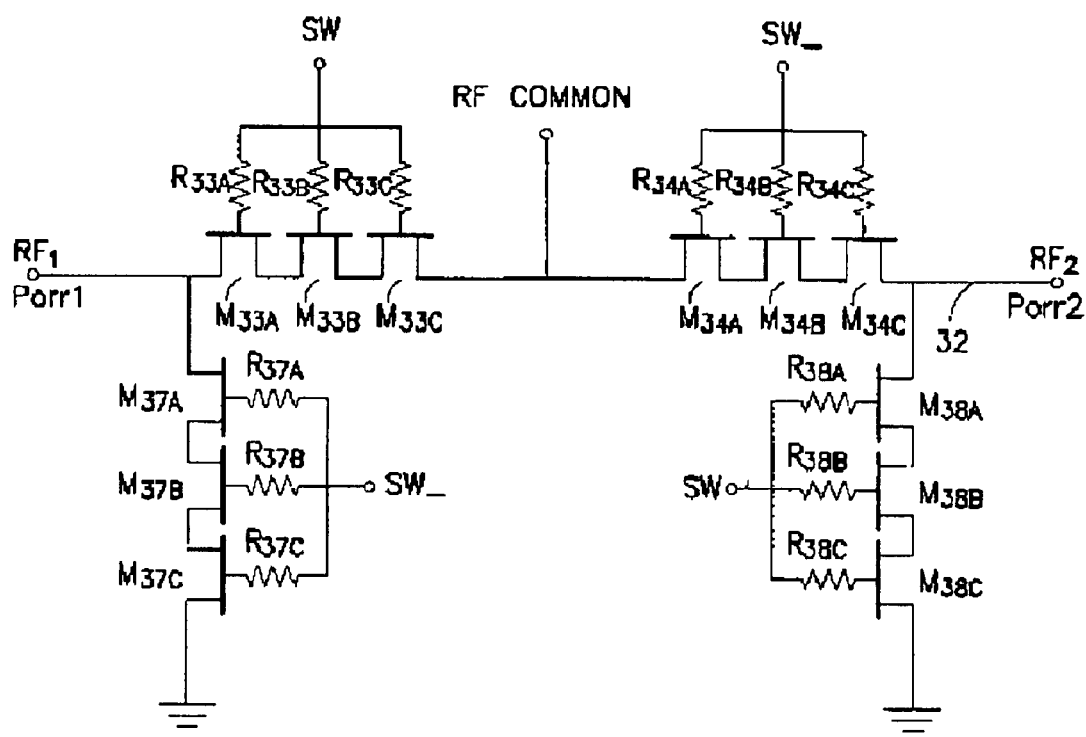
FIG. 24 is a diagram showing a conventional switch circuit device.
Figure 25:
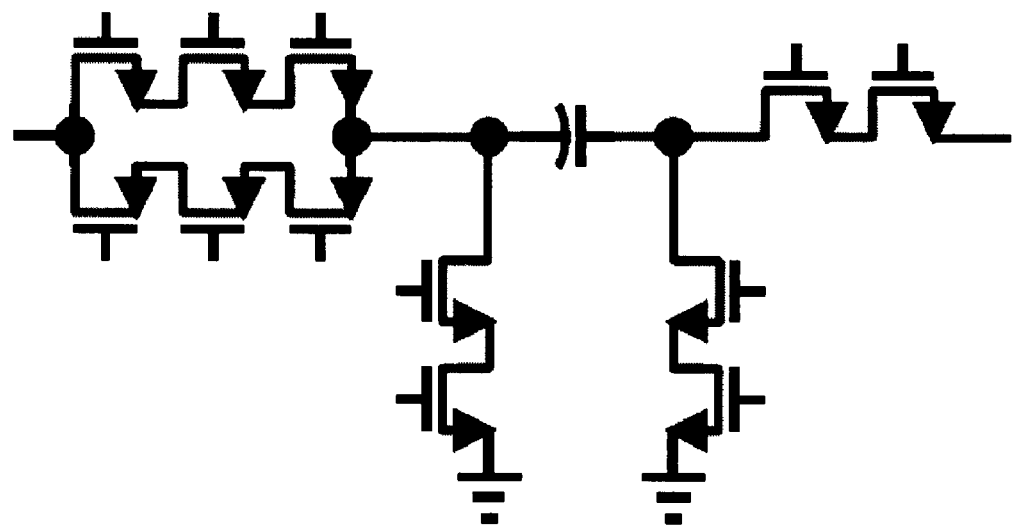
FIG. 25 is a diagram showing a conventional switch circuit device.
Figure 26:
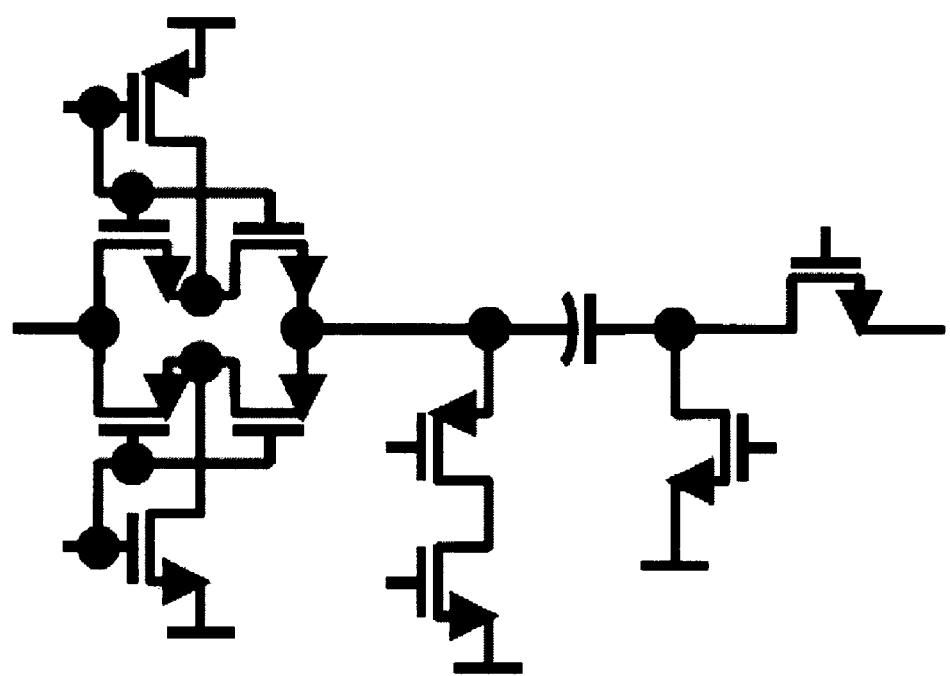
FIG. 26 is a diagram showing a conventional switch circuit device.

FIG. 22 is a diagram showing a charge sampling filter circuit 703 as an embodiment of the sampling circuit of the present invention. An operation of the charge sampling filter circuit 703 will be briefly described. Initially, switch circuit devices 67, 68, 69 and 70 are turned ON/OFF in sequence with a delay of ¼ of the cycle between each device so as to sample an input voltage. In this case, clock signals are produced by, for example, sequentially shifting an LO signal by ¼ of its cycle. After sampled charges are loaded into capacitors 75 and 76 by the switch circuit devices 67 and 68, switch circuit devices 71 and 72 are simultaneously turned ON/OFF, so that combined charges of the capacitors 75 and 76 are output. Similarly, after sampled charges are loaded into capacitors 77 and 78 by the switch circuit devices 69 and 70, switch circuit devices 73 and 74 are simultaneously turned ON/OFF, so that combined charges of the capacitors 77 and 78 are output. By such an operation, of an input signal, components in the vicinity of ½ of the frequency of the LO signal and harmonic components are suppressed, thereby providing frequency selectivity.

Thus, in each sampling circuit device described as an example, the above-described operation is performed using any of the switch circuit devices of the first to sixth embodiments of the present invention, so that the ON-state insertion loss is reduced. Thereby, a quick charge time is achieved, resulting in a reduction in occurrence of noise. In addition, the OFF-state isolation characteristics are improved, so that an error in a sampling output signal due to signal leakage is reduced.

While the invention has been described in detail, the foregoing description is in all aspects illustrative and not restrictive. It is understood that numerous other modifications and variations can be devised without departing from the scope of the invention.

What is claimed is:

1. A switch circuit device comprising:
   a plurality of n-ch MOSFETs whose gates are connected together and whose drains and sources are connected in series;
   a p-ch MOSFET whose gate is connected to the gates of the plurality of n-ch MOSFETs and whose drain is connected to the source and drain connected to each other of at least one pair of adjacent n-ch MOSFETs of the plurality of n-ch MOSFETs; and a voltage changing circuit for applying a low voltage to the source of the p-ch MOSFET while a high-level control voltage is applied to the gate of the p-ch MOSFET, the low voltage being lower than the high-level control voltage, and a high voltage to the source of the p-ch MOSFET while a low-level control voltage is applied to the gate of the p-ch MOSFET, the high voltage being higher than the low-level control voltage.

2. The switch circuit device according to claim 1, wherein the voltage changing circuit includes an odd number of inverters connected in series for inverting and outputting a control voltage to be applied to the gate of the p-ch MOSFET.

3. The switch circuit device according to claim 1, wherein the high voltage applied to the source of the p-ch MOSFET is equal to a voltage applied to a back gate of the p-ch MOSFET.

4. The switch circuit device according to claim 1, wherein the high voltage applied to the source of the p-ch MOSFET is a voltage which causes a GIDL current of the n-ch MOSFET to be smaller than or equal to a predetermined value, and the low voltage applied to the source of the p-ch MOSFET is a voltage which causes a GIDL current of the p-ch MOSFET to be smaller than or equal to a predetermined value.

5. The switch circuit device according to claim 1, wherein, depending on the high- or low-level control voltage applied to the gate of the p-ch MOSFET, the voltage changing circuit applies a voltage which causes a sum of a GIDL current and a threshold current of the p-ch MOSFET to be smaller than or equal to a predetermined value, to a back gate of the p-ch MOSFET, and a voltage which causes a sum of a GIDL current and a threshold current of the n-ch MOSFET to be smaller than or equal to a predetermined value, to back gates of the plurality of n-ch MOSFETs.

6. The switch circuit device according to claim 1, wherein a resistor or an inductor is inserted in the gate of each of the n-ch MOSFET and the p-ch MOSFET.

7. The switch circuit device according to claim 1, wherein a resistor or an inductor is inserted in a back gate of each of the n-ch MOSFET and the p-ch MOSFET.

8. A switch circuit comprising:

a plurality of p-ch MOSFETs whose gates are connected together and whose drains and sources are connected in series;

an n-ch MOSFET whose gate is connected to the gates of the plurality of p-ch MOSFETs and whose source is connected to the source and drain connected to each other of at least one pair of adjacent p-ch MOSFETs of the plurality of p-ch MOSFETs;

an inverter for inverting and outputting a control voltage; and a voltage changing circuit for applying a high voltage to the drain of the n-ch MOSFET while a low-level control voltage inverted and output by the inverter is applied to the gate of the n-ch MOSFET, the high voltage being higher than the low-level control voltage, and a low voltage to the drain of the n-ch MOSFET while a high-level control voltage inverted and output by the inverter is applied to the gate of the n-ch MOSFET, the low voltage being lower than the high-level control voltage.

9. The switch circuit device according to claim 8, wherein the voltage changing circuit applies a control voltage to be input to the inverter, as it is, to the drain of the n-ch MOSFET.

10. The switch circuit device according to claim 8, wherein the low voltage applied to the drain of the n-ch MOSFET is 0 V.

11. The switch circuit device according to claim 8, wherein the low voltage applied to the drain of the n-ch MOSFET is a voltage which causes a GIDL current of the p-ch MOSFET to be smaller than or equal to a predetermined value, and the high voltage applied to the drain of the n-ch MOSFET is a voltage which causes a GIDL current of the n-ch MOSFET to be smaller than or equal to a predetermined value.

12. The switch circuit device according to claim 8, wherein, depending on the high- or low-level control voltage inverted and output by the inverter and applied to the gate of the n-ch MOSFET, the voltage changing circuit applies a voltage which causes a sum of a GIDL current and a threshold current of the n-ch MOSFET to be smaller than or equal to a predetermined value, to a back gate of the n-ch MOSFET, and a voltage which causes a sum of a GIDL current and a threshold current of the p-ch MOSFET to be smaller than or equal to a predetermined value, to back gates of the plurality of p-ch MOSFETs.

13. The switch circuit device according to claim 9, wherein the voltage changing circuit includes an even number of inverters connected in series for outputting the control voltage.

14. The switch circuit device according to claim 8, wherein a resistor or an inductor is inserted in the gates of the n-ch MOSFET and the p-ch MOSFET.

15. The switch circuit device according to claim 8, wherein a resistor or an inductor is inserted in back gates of the n-ch MOSFET and the p-ch MOSFET.

* * * * *